(12) United States Patent
Kidd et al.

(10) Patent No.: US 9,319,034 B2
(45) Date of Patent: Apr. 19, 2016

(54) SLEW BASED PROCESS AND BIAS MONITORS AND RELATED METHODS

(71) Applicant: Mie Fujitsu Semiconductor Limited, Kuwana, Mie (JP)

(72) Inventors: David A. Kidd, San Jose, CA (US); Edward J. Boling, Fremont, CA (US); Vineet Agrawal, San Jose, CA (US); Samuel Leshner, Los Gatos, CA (US); Augustine Kuo, Berkeley, CA (US); Sang-Soo Lee, Cupertino, CA (US); Chao-Wu Chen, San Jose, CA (US)

(73) Assignee: Mie Fujitsu Semiconductor Limited, Kuwana, Mie (JP)

( * ) Notice: Subject to any disclaimer, the term of this patent is extended or adjusted under 35 U.S.C. 154(b) by 0 days.

(21) Appl. No.: 14/755,689

(22) Filed: Jun. 30, 2015

(65) Prior Publication Data
US 2015/0303905 A1    Oct. 22, 2015

Related U.S. Application Data

(62) Division of application No. 14/081,264, filed on Nov. 15, 2013, now Pat. No. 9,093,997.

(60) Provisional application No. 61/726,968, filed on Nov. 15, 2012, provisional application No. 61/739,991, filed on Dec. 20, 2012.

(51) Int. Cl.
*H03K 3/01* (2006.01)
*G05F 1/10* (2006.01)
(Continued)

(52) U.S. Cl.
CPC *H03K 5/05* (2013.01); *H01L 22/34* (2013.01); *H03K 3/017* (2013.01); *H03K 5/04* (2013.01)

(58) Field of Classification Search
USPC ......... 327/142, 143, 198, 164–180, 108–112, 327/379, 389, 391; 326/22–27, 81–87
See application file for complete search history.

(56) References Cited

U.S. PATENT DOCUMENTS 3,958,266 A    5/1976   Athanas
4,000,504 A    12/1976  Berger
(Continued)

FOREIGN PATENT DOCUMENTS

EP    0274278    7/1988
EP    0312237    4/1989
(Continued)

OTHER PUBLICATIONS

Banerjee, et al., "Compensating Non-Optical Effects using Electrically-Driven Optical Proximity Correction", Proc. of SPIE vol. 7275 7275OE (2009).
(Continued)

*Primary Examiner* — Brandon S Cole
(74) *Attorney, Agent, or Firm* — Baker Botts L.L.P.

(57) ABSTRACT

An integrated circuit can include at least one slew generator circuit comprising at least one body biasable reference transistor, the slew generator circuit configured to generate at least a first signal having a slew rate that varies according to characteristics of the reference transistor; a pulse generator circuit configured to generate a pulse signal having a first pulse with a duration corresponding to the slew rate of the first signal; and a counter configured to generate a count value corresponding to a duration of the first pulse.

13 Claims, 10 Drawing Sheets

(51) Int. Cl.
*G05F 3/02* (2006.01)
*H03K 5/05* (2006.01)
*H01L 21/66* (2006.01)
*H03K 5/04* (2006.01)
*H03K 3/017* (2006.01)

(56) References Cited

U.S. PATENT DOCUMENTS

| | | |
|---|---|---|
| 4,021,835 A | 5/1977 | Etoh |
| 4,242,691 A | 12/1980 | Kotani |
| 4,276,095 A | 6/1981 | Beilstein, Jr. |
| 4,315,781 A | 2/1982 | Henderson |
| 4,518,926 A | 5/1985 | Swanson |
| 4,559,091 A | 12/1985 | Allen |
| 4,578,128 A | 3/1986 | Mundt |
| 4,617,066 A | 10/1986 | Vasudev |
| 4,662,061 A | 5/1987 | Malhi |
| 4,761,384 A | 8/1988 | Neppl |
| 4,780,748 A | 10/1988 | Cunningham |
| 4,819,043 A | 4/1989 | Yazawa |
| 4,885,477 A | 12/1989 | Bird |
| 4,908,681 A | 3/1990 | Nishida |
| 4,945,254 A | 7/1990 | Robbins |
| 4,956,311 A | 9/1990 | Liou |
| 5,034,337 A | 7/1991 | Mosher |
| 5,144,378 A | 9/1992 | Hikosaka |
| 5,156,989 A | 10/1992 | Williams |
| 5,156,990 A | 10/1992 | Mitchell |
| 5,166,765 A | 11/1992 | Lee |
| 5,208,473 A | 5/1993 | Komori |
| 5,294,821 A | 3/1994 | Iwamatsu |
| 5,298,763 A | 3/1994 | Shen |
| 5,369,288 A | 11/1994 | Usuki |
| 5,373,186 A | 12/1994 | Schubert |
| 5,384,476 A | 1/1995 | Nishizawa |
| 5,426,328 A | 6/1995 | Yilmaz |
| 5,444,008 A | 8/1995 | Han |
| 5,552,332 A | 9/1996 | Tseng |
| 5,559,368 A | 9/1996 | Hu |
| 5,608,253 A | 3/1997 | Liu |
| 5,622,880 A | 4/1997 | Burr |
| 5,624,863 A | 4/1997 | Helm |
| 5,625,568 A | 4/1997 | Edwards |
| 5,641,980 A | 6/1997 | Yamaguchi |
| 5,663,583 A | 9/1997 | Matloubian |
| 5,712,501 A | 1/1998 | Davies |
| 5,719,422 A | 2/1998 | Burr |
| 5,726,488 A | 3/1998 | Watanabe |
| 5,726,562 A | 3/1998 | Mizuno |
| 5,731,626 A | 3/1998 | Eaglesham |
| 5,736,419 A | 4/1998 | Naem |
| 5,753,555 A | 5/1998 | Hada |
| 5,754,826 A | 5/1998 | Gamal |
| 5,756,365 A | 5/1998 | Kakumu |
| 5,763,921 A | 6/1998 | Okumura |
| 5,780,899 A | 7/1998 | Hu |
| 5,847,419 A | 12/1998 | Imai |
| 5,856,003 A | 1/1999 | Chiu |
| 5,861,334 A | 1/1999 | Rho |
| 5,877,049 A | 3/1999 | Liu |
| 5,885,876 A | 3/1999 | Dennen |
| 5,889,315 A | 3/1999 | Farrenkopf |
| 5,895,954 A | 4/1999 | Yasumura |
| 5,899,714 A | 5/1999 | Farremkopf |
| 5,918,129 A | 6/1999 | Fulford, Jr. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin |
| 5,985,705 A | 11/1999 | Seliskar |
| 5,989,963 A | 11/1999 | Luning |
| 6,001,695 A | 12/1999 | Wu |
| 6,020,227 A | 2/2000 | Bulucea |
| 6,043,139 A | 3/2000 | Eaglesham |
| 6,060,345 A | 5/2000 | Hause |
| 6,060,364 A | 5/2000 | Maszara |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son |
| 6,121,153 A | 9/2000 | Kikkawa |
| 6,147,383 A | 11/2000 | Kuroda |
| 6,153,920 A | 11/2000 | Gossmann |
| 6,157,073 A | 12/2000 | Lehongres |
| 6,175,582 B1 | 1/2001 | Naito |
| 6,184,112 B1 | 2/2001 | Maszara |
| 6,190,979 B1 | 2/2001 | Radens |
| 6,194,259 B1 | 2/2001 | Nayak |
| 6,198,157 B1 | 3/2001 | Ishida |
| 6,218,892 B1 | 4/2001 | Soumyanath |
| 6,218,895 B1 | 4/2001 | De |
| 6,221,724 B1 | 4/2001 | Yu |
| 6,229,188 B1 | 5/2001 | Aoki |
| 6,232,164 B1 | 5/2001 | Tsai |
| 6,235,597 B1 | 5/2001 | Miles |
| 6,245,618 B1 | 6/2001 | An |
| 6,268,640 B1 | 7/2001 | Park |
| 6,271,070 B2 | 8/2001 | Kotani |
| 6,271,551 B1 | 8/2001 | Schmitz |
| 6,288,429 B1 | 9/2001 | Iwata |
| 6,297,132 B1 | 10/2001 | Zhang |
| 6,300,177 B1 | 10/2001 | Sundaresan |
| 6,313,489 B1 | 11/2001 | Letavic |
| 6,319,799 B1 | 11/2001 | Ouyang |
| 6,320,222 B1 | 11/2001 | Forbes |
| 6,323,525 B1 | 11/2001 | Noguchi |
| 6,326,666 B1 | 12/2001 | Bernstein |
| 6,335,233 B1 | 1/2002 | Cho |
| 6,358,806 B1 | 3/2002 | Puchner |
| 6,380,019 B1 | 4/2002 | Yu |
| 6,391,752 B1 | 5/2002 | Colinge |
| 6,426,260 B1 | 7/2002 | Hshieh |
| 6,426,279 B1 | 7/2002 | Huster |
| 6,432,754 B1 | 8/2002 | Assaderaghi |
| 6,444,550 B1 | 9/2002 | Hao |
| 6,444,551 B1 | 9/2002 | Ku |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall |
| 6,482,714 B1 | 11/2002 | Hieda |
| 6,489,224 B1 | 12/2002 | Burr |
| 6,492,232 B1 | 12/2002 | Tang |
| 6,500,739 B1 | 12/2002 | Wang |
| 6,503,801 B1 | 1/2003 | Rouse |
| 6,503,805 B2 | 1/2003 | Wang |
| 6,506,640 B1 | 1/2003 | Ishida |
| 6,518,623 B1 | 2/2003 | Oda |
| 6,521,470 B1 | 2/2003 | Lin |
| 6,534,373 B1 | 3/2003 | Yu |
| 6,541,328 B2 | 4/2003 | Whang |
| 6,541,829 B2 | 4/2003 | Nishinohara |
| 6,548,842 B1 | 4/2003 | Bulucea |
| 6,551,885 B1 | 4/2003 | Yu |
| 6,552,377 B1 | 4/2003 | Yu |
| 6,573,129 B2 | 6/2003 | Hoke |
| 6,576,535 B2 | 6/2003 | Drobny |
| 6,600,200 B1 | 7/2003 | Lustig |
| 6,620,671 B1 | 9/2003 | Wang |
| 6,624,488 B1 | 9/2003 | Kim |
| 6,627,473 B1 | 9/2003 | Oikawa |
| 6,630,710 B1 | 10/2003 | Augusto |
| 6,660,605 B1 | 12/2003 | Liu |
| 6,662,350 B2 | 12/2003 | Fried |
| 6,667,200 B2 | 12/2003 | Sohn |
| 6,670,260 B1 | 12/2003 | Yu |
| 6,693,333 B1 | 2/2004 | Yu |
| 6,724,008 B2 | 4/2004 | Fitzgerald |
| 6,730,568 B2 | 5/2004 | Sohn |
| 6,737,724 B2 | 5/2004 | Hieda |

(56) References Cited

U.S. PATENT DOCUMENTS

| | | |
|---|---|---|
| 6,743,291 B2 | 6/2004 | Ang |
| 6,743,684 B2 | 6/2004 | Liu |
| 6,751,519 B1 | 6/2004 | Satya |
| 6,753,230 B2 | 6/2004 | Sohn |
| 6,760,900 B2 | 7/2004 | Rategh |
| 6,770,944 B2 | 8/2004 | Nishinohara |
| 6,787,424 B1 | 9/2004 | Yu |
| 6,797,553 B2 | 9/2004 | Adkisson |
| 6,797,602 B1 | 9/2004 | Kluth |
| 6,797,994 B1 | 9/2004 | Hoke |
| 6,808,004 B2 | 10/2004 | Kamm |
| 6,808,994 B1 | 10/2004 | Wang |
| 6,813,750 B2 | 11/2004 | Usami |
| 6,821,825 B2 | 11/2004 | Todd |
| 6,821,852 B2 | 11/2004 | Rhodes |
| 6,822,297 B2 | 11/2004 | Nandakumar |
| 6,831,292 B2 | 12/2004 | Currie |
| 6,835,639 B2 | 12/2004 | Rotondaro |
| 6,852,602 B2 | 2/2005 | Kanzawa |
| 6,852,603 B2 | 2/2005 | Chakravarthi |
| 6,881,641 B2 | 4/2005 | Wieczorek |
| 6,881,987 B2 | 4/2005 | Sohn |
| 6,891,439 B2 | 5/2005 | Jachne |
| 6,893,947 B2 | 5/2005 | Martinez |
| 6,900,519 B2 | 5/2005 | Cantell |
| 6,901,564 B2 | 5/2005 | Stine |
| 6,916,698 B2 | 7/2005 | Mocuta |
| 6,917,237 B1 | 7/2005 | Tschanz |
| 6,927,463 B2 | 8/2005 | Iwata |
| 6,928,128 B1 | 8/2005 | Sidiropoulos |
| 6,930,007 B2 | 8/2005 | Bu |
| 6,930,360 B2 | 8/2005 | Yamauchi |
| 6,957,163 B2 | 10/2005 | Ando |
| 6,963,090 B2 | 11/2005 | Passlack |
| 6,995,397 B2 | 2/2006 | Yamashita |
| 7,002,214 B1 | 2/2006 | Boyd |
| 7,008,836 B2 | 3/2006 | Algotsson |
| 7,013,359 B1 | 3/2006 | Li |
| 7,015,546 B2 | 3/2006 | Herr |
| 7,015,741 B2 | 3/2006 | Tschanz |
| 7,022,559 B2 | 4/2006 | Barnak |
| 7,036,098 B2 | 4/2006 | Eleyan |
| 7,038,258 B2 | 5/2006 | Liu |
| 7,039,881 B2 | 5/2006 | Regan |
| 7,045,456 B2 | 5/2006 | Murto |
| 7,057,216 B2 | 6/2006 | Ouyang |
| 7,061,058 B2 | 6/2006 | Chakravarthi |
| 7,064,039 B2 | 6/2006 | Li |
| 7,064,399 B2 | 6/2006 | Babcock |
| 7,071,103 B2 | 7/2006 | Chan |
| 7,078,325 B2 | 7/2006 | Curello |
| 7,078,776 B2 | 7/2006 | Nishinohara |
| 7,089,513 B2 | 8/2006 | Bard |
| 7,089,515 B2 | 8/2006 | Hanafi |
| 7,091,093 B1 | 8/2006 | Noda |
| 7,105,399 B1 | 9/2006 | Dakshina-Murthy |
| 7,109,099 B2 | 9/2006 | Tan |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch |
| 7,169,675 B2 | 1/2007 | Tan |
| 7,170,120 B2 | 1/2007 | Datta |
| 7,176,137 B2 | 2/2007 | Perng |
| 7,186,598 B2 | 3/2007 | Yamauchi |
| 7,189,627 B2 | 3/2007 | Wu |
| 7,199,430 B2 | 4/2007 | Babcock |
| 7,202,517 B2 | 4/2007 | Dixit |
| 7,208,354 B2 | 4/2007 | Bauer |
| 7,211,871 B2 | 5/2007 | Cho |
| 7,221,021 B2 | 5/2007 | Wu |
| 7,223,646 B2 | 5/2007 | Miyashita |
| 7,226,833 B2 | 6/2007 | White |
| 7,226,843 B2 | 6/2007 | Weber |
| 7,230,680 B2 | 6/2007 | Fujisawa |
| 7,235,822 B2 | 6/2007 | Li |
| 7,256,639 B1 | 8/2007 | Koniaris |
| 7,259,428 B2 | 8/2007 | Inaba |
| 7,260,562 B2 | 8/2007 | Czajkowski |
| 7,294,877 B2 | 11/2007 | Rueckes |
| 7,297,994 B2 | 11/2007 | Wieczorek |
| 7,301,208 B2 | 11/2007 | Handa |
| 7,304,350 B2 | 12/2007 | Misaki |
| 7,307,471 B2 | 12/2007 | Gammie |
| 7,312,500 B2 | 12/2007 | Miyashita |
| 7,323,754 B2 | 1/2008 | Ema |
| 7,332,439 B2 | 2/2008 | Lindert |
| 7,348,629 B2 | 3/2008 | Chu |
| 7,354,833 B2 | 4/2008 | Liaw |
| 7,380,225 B2 | 5/2008 | Joshi |
| 7,398,497 B2 | 7/2008 | Sato |
| 7,402,207 B1 | 7/2008 | Besser |
| 7,402,872 B2 | 7/2008 | Murthy |
| 7,416,605 B2 | 8/2008 | Zollner |
| 7,427,788 B2 | 9/2008 | Li |
| 7,442,971 B2 | 10/2008 | Wirbeleit |
| 7,449,733 B2 | 11/2008 | Inaba |
| 7,462,908 B2 | 12/2008 | Bol |
| 7,469,164 B2 | 12/2008 | Du-Nour |
| 7,470,593 B2 | 12/2008 | Rouh |
| 7,485,536 B2 | 2/2009 | Jin |
| 7,487,474 B2 | 2/2009 | Ciplickas |
| 7,491,988 B2 | 2/2009 | Tolchinsky |
| 7,494,861 B2 | 2/2009 | Chu |
| 7,496,862 B2 | 2/2009 | Chang |
| 7,496,867 B2 | 2/2009 | Turner |
| 7,498,637 B2 | 3/2009 | Yamaoka |
| 7,501,324 B2 | 3/2009 | Babcock |
| 7,503,020 B2 | 3/2009 | Allen |
| 7,507,999 B2 | 3/2009 | Kusumoto |
| 7,514,766 B2 | 4/2009 | Yoshida |
| 7,521,323 B2 | 4/2009 | Surdeanu |
| 7,531,393 B2 | 5/2009 | Doyle |
| 7,531,836 B2 | 5/2009 | Liu |
| 7,538,364 B2 | 5/2009 | Twynam |
| 7,538,412 B2 | 5/2009 | Schulze |
| 7,562,233 B1 | 7/2009 | Sheng |
| 7,564,105 B2 | 7/2009 | Chi |
| 7,566,600 B2 | 7/2009 | Mouli |
| 7,569,456 B2 | 8/2009 | Ko |
| 7,586,322 B1 | 9/2009 | Xu |
| 7,592,241 B2 | 9/2009 | Takao |
| 7,595,243 B1 | 9/2009 | Bulucea |
| 7,598,142 B2 | 10/2009 | Ranade |
| 7,605,041 B2 | 10/2009 | Ema |
| 7,605,060 B2 | 10/2009 | Meunier-Beillard |
| 7,605,429 B2 | 10/2009 | Bernstein |
| 7,608,496 B2 | 10/2009 | Chu |
| 7,615,802 B2 | 11/2009 | Elpelt |
| 7,622,341 B2 | 11/2009 | Chudzik |
| 7,638,380 B2 | 12/2009 | Pearce |
| 7,642,140 B2 | 1/2010 | Bae |
| 7,644,377 B1 | 1/2010 | Sax |
| 7,645,665 B2 | 1/2010 | Kubo |
| 7,651,920 B2 | 1/2010 | Siprak |
| 7,655,523 B2 | 2/2010 | Babcock |
| 7,673,273 B2 | 3/2010 | Madurawe |
| 7,675,126 B2 | 3/2010 | Cho |
| 7,675,317 B2 | 3/2010 | Perisetty |
| 7,678,638 B2 | 3/2010 | Chu |
| 7,681,628 B2 | 3/2010 | Josi |
| 7,682,887 B2 | 3/2010 | Dokumaci |
| 7,683,442 B1 | 3/2010 | Burr |
| 7,696,000 B2 | 4/2010 | Liu |
| 7,704,822 B2 | 4/2010 | Jcong |
| 7,704,844 B2 | 4/2010 | Zhu |
| 7,709,828 B2 | 5/2010 | Braithwaite |
| 7,723,750 B2 | 5/2010 | Zhu |
| 7,737,472 B2 | 6/2010 | Kondo |
| 7,741,138 B2 | 6/2010 | Cho |
| 7,741,200 B2 | 6/2010 | Cho |
| 7,745,270 B2 | 6/2010 | Shah |
| 7,750,374 B2 | 7/2010 | Capasso |
| 7,750,381 B2 | 7/2010 | Hokazono |

(56) References Cited

U.S. PATENT DOCUMENTS

| | | | |
|---|---|---|---|
| 7,750,405 B2 | 7/2010 | Nowak |
| 7,750,682 B2 | 7/2010 | Bernstein |
| 7,755,144 B2 | 7/2010 | Li |
| 7,755,146 B2 | 7/2010 | Helm |
| 7,759,206 B2 | 7/2010 | Luo |
| 7,759,714 B2 | 7/2010 | Itoh |
| 7,761,820 B2 | 7/2010 | Berger |
| 7,795,677 B2 | 9/2010 | Bangsaruntip |
| 7,808,045 B2 | 10/2010 | Kawahara |
| 7,808,410 B2 | 10/2010 | Kim |
| 7,811,873 B2 | 10/2010 | Mochizuki |
| 7,811,881 B2 | 10/2010 | Cheng |
| 7,818,702 B2 | 10/2010 | Mandelman |
| 7,821,066 B2 | 10/2010 | Lebby |
| 7,829,402 B2 | 11/2010 | Matocha |
| 7,831,873 B1 | 11/2010 | Trimberger |
| 7,846,822 B2 | 12/2010 | Seebauer |
| 7,855,118 B2 | 12/2010 | Hoentschel |
| 7,859,013 B2 | 12/2010 | Chen |
| 7,863,163 B2 | 1/2011 | Bauer |
| 7,867,835 B2 | 1/2011 | Lee |
| 7,883,977 B2 | 2/2011 | Babcock |
| 7,888,205 B2 | 2/2011 | Herner |
| 7,888,747 B2 | 2/2011 | Hokazono |
| 7,895,546 B2 | 2/2011 | Lahner |
| 7,897,495 B2 | 3/2011 | Ye |
| 7,906,413 B2 | 3/2011 | Cardone |
| 7,906,813 B2 | 3/2011 | Kato |
| 7,910,419 B2 | 3/2011 | Fenouillet-Beranger |
| 7,919,791 B2 | 4/2011 | Flynn |
| 7,926,018 B2 | 4/2011 | Moroz |
| 7,935,984 B2 | 5/2011 | Nakano |
| 7,941,776 B2 | 5/2011 | Majumder |
| 7,943,462 B1 | 5/2011 | Beyer |
| 7,945,800 B2 | 5/2011 | Gomm |
| 7,948,008 B2 | 5/2011 | Liu |
| 7,952,147 B2 | 5/2011 | Ueno |
| 7,960,232 B2 | 6/2011 | King |
| 7,960,238 B2 | 6/2011 | Kohli |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell |
| 7,989,900 B2 | 8/2011 | Haensch |
| 7,994,573 B2 | 8/2011 | Pan |
| 8,004,024 B2 | 8/2011 | Furukawa |
| 8,012,827 B2 | 9/2011 | Yu |
| 8,029,620 B2 | 10/2011 | Kim |
| 8,039,332 B2 | 10/2011 | Bernard |
| 8,046,598 B2 | 10/2011 | Lee |
| 8,048,791 B2 | 11/2011 | Hargrove |
| 8,048,810 B2 | 11/2011 | Tsai |
| 8,051,340 B2 | 11/2011 | Cranford, Jr. |
| 8,053,306 B2 | 11/2011 | Carter |
| 8,053,340 B2 | 11/2011 | Colombeau |
| 8,063,466 B2 | 11/2011 | Kurita |
| 8,067,279 B2 | 11/2011 | Sadra |
| 8,067,280 B2 | 11/2011 | Wang |
| 8,067,302 B2 | 11/2011 | Li |
| 8,076,719 B2 | 12/2011 | Zeng |
| 8,097,529 B2 | 1/2012 | Krull |
| 8,103,983 B2 | 1/2012 | Agarwal |
| 8,105,891 B2 | 1/2012 | Yeh |
| 8,106,424 B2 | 1/2012 | Schruefer |
| 8,106,481 B2 | 1/2012 | Rao |
| 8,110,487 B2 | 2/2012 | Griebenow |
| 8,114,761 B2 | 2/2012 | Mandrekar |
| 8,119,482 B2 | 2/2012 | Bhalla |
| 8,120,069 B2 | 2/2012 | Hynecek |
| 8,129,246 B2 | 3/2012 | Babcock |
| 8,129,797 B2 | 3/2012 | Chen |
| 8,134,159 B2 | 3/2012 | Hokazono |
| 8,143,120 B2 | 3/2012 | Kerr |
| 8,143,124 B2 | 3/2012 | Challa |
| 8,143,678 B2 | 3/2012 | Kim |
| 8,148,774 B2 | 4/2012 | Mori |
| 8,163,619 B2 | 4/2012 | Yang |
| 8,169,002 B2 | 5/2012 | Chang |
| 8,170,857 B2 | 5/2012 | Joshi |
| 8,173,499 B2 | 5/2012 | Chung |
| 8,173,502 B2 | 5/2012 | Yan |
| 8,176,461 B1 | 5/2012 | Trimberger |
| 8,178,430 B2 | 5/2012 | Kim |
| 8,179,530 B2 | 5/2012 | Levy |
| 8,183,096 B2 | 5/2012 | Wirbeleit |
| 8,183,107 B2 | 5/2012 | Mathur |
| 8,185,865 B2 | 5/2012 | Gupta |
| 8,187,959 B2 | 5/2012 | Pawlak |
| 8,188,542 B2 | 5/2012 | Yoo |
| 8,196,545 B2 | 6/2012 | Kurosawa |
| 8,201,122 B2 | 6/2012 | Dewey, III |
| 8,214,190 B2 | 7/2012 | Joshi |
| 8,217,423 B2 | 7/2012 | Liu |
| 8,225,255 B2 | 7/2012 | Ouyang |
| 8,227,307 B2 | 7/2012 | Chen |
| 8,236,661 B2 | 8/2012 | Dennard |
| 8,239,803 B2 | 8/2012 | Kobayashi |
| 8,247,300 B2 | 8/2012 | Babcock |
| 8,255,843 B2 | 8/2012 | Chen |
| 8,258,026 B2 | 9/2012 | Bulucea |
| 8,266,567 B2 | 9/2012 | El Yahyaoui |
| 8,273,617 B2 | 9/2012 | Thompson |
| 8,286,180 B2 | 10/2012 | Foo |
| 8,288,798 B2 | 10/2012 | Passlack |
| 8,294,180 B2 | 10/2012 | Doyle |
| 8,299,562 B2 | 10/2012 | Li |
| 8,324,059 B2 | 12/2012 | Guo |
| 8,372,721 B2 | 2/2013 | Chen |
| 8,466,473 B2 | 6/2013 | Cai |
| 8,569,128 B2 | 10/2013 | Shifren |
| 8,803,233 B2 | 8/2014 | Chang |
| 2001/0014495 A1 | 8/2001 | Yu |
| 2002/0042184 A1 | 4/2002 | Nandakumar |
| 2003/0006415 A1 | 1/2003 | Yokogawa |
| 2003/0047763 A1 | 3/2003 | Hieda |
| 2003/0122203 A1 | 7/2003 | Nishinohara |
| 2003/0173626 A1 | 9/2003 | Burr |
| 2003/0183856 A1 | 10/2003 | Wieczorek |
| 2003/0215992 A1 | 11/2003 | Sohn |
| 2004/0075118 A1 | 4/2004 | Heinemann |
| 2004/0075143 A1 | 4/2004 | Bae |
| 2004/0084731 A1 | 5/2004 | Matsuda |
| 2004/0087090 A1 | 5/2004 | Gradowski |
| 2004/0126947 A1 | 7/2004 | Sohn |
| 2004/0175893 A1 | 9/2004 | Vatus |
| 2004/0180488 A1 | 9/2004 | Lee |
| 2004/0239391 A1* | 12/2004 | Culler ............ H03K 19/00384 327/170 |
| 2005/0106824 A1 | 5/2005 | Alberto |
| 2005/0116282 A1 | 6/2005 | Pattanayak |
| 2005/0250289 A1 | 11/2005 | Babcock |
| 2005/0280075 A1 | 12/2005 | Ema |
| 2006/0006915 A1* | 1/2006 | Yan ................ H03K 17/164 327/175 |
| 2006/0022270 A1 | 2/2006 | Boyd |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock |
| 2006/0203581 A1 | 9/2006 | Joshi |
| 2006/0220114 A1 | 10/2006 | Miyashita |
| 2006/0223248 A1 | 10/2006 | Venugopal |
| 2007/0040222 A1 | 2/2007 | Van Camp |
| 2007/0117326 A1 | 5/2007 | Tan |
| 2007/0158790 A1 | 7/2007 | Rao |
| 2007/0212861 A1 | 9/2007 | Chidambarrao |
| 2007/0238253 A1 | 10/2007 | Tucker |
| 2008/0067589 A1 | 3/2008 | Ito |
| 2008/0108208 A1 | 5/2008 | Arevalo |
| 2008/0169493 A1 | 7/2008 | Lee |
| 2008/0169516 A1 | 7/2008 | Chung |
| 2008/0197439 A1 | 8/2008 | Goerlach |

(56) References Cited

U.S. PATENT DOCUMENTS

| | | |
|---|---|---|
| 2008/0227250 A1 | 9/2008 | Ranade |
| 2008/0237661 A1 | 10/2008 | Ranade |
| 2008/0258198 A1 | 10/2008 | Bojarczuk |
| 2008/0272409 A1 | 11/2008 | Sonkale |
| 2009/0011537 A1 | 1/2009 | Shimizu |
| 2009/0057746 A1 | 3/2009 | Sugll |
| 2009/0108350 A1 | 4/2009 | Cai |
| 2009/0134468 A1 | 5/2009 | Tsuchiya |
| 2009/0224319 A1 | 9/2009 | Kohli |
| 2009/0243667 A1* | 10/2009 | Park ............ H03K 19/0027 327/109 |
| 2009/0302388 A1 | 12/2009 | Cai |
| 2009/0309140 A1 | 12/2009 | Khamankar |
| 2009/0311837 A1 | 12/2009 | Kapoor |
| 2009/0321849 A1 | 12/2009 | Miyamura |
| 2010/0012988 A1 | 1/2010 | Yang |
| 2010/0038724 A1 | 2/2010 | Anderson |
| 2010/0100856 A1 | 4/2010 | Mittal |
| 2010/0148153 A1 | 6/2010 | Hudait |
| 2010/0149854 A1 | 6/2010 | Vora |
| 2010/0187641 A1 | 7/2010 | Zhu |
| 2010/0207182 A1 | 8/2010 | Paschal |
| 2010/0270600 A1 | 10/2010 | Inukai |
| 2011/0059588 A1 | 3/2011 | Kang |
| 2011/0073961 A1 | 3/2011 | Dennard |
| 2011/0074498 A1 | 3/2011 | Thompson |
| 2011/0079860 A1 | 4/2011 | Verhulst |
| 2011/0079861 A1 | 4/2011 | Shifren |
| 2011/0095811 A1 | 4/2011 | Chi |
| 2011/0147828 A1 | 6/2011 | Murthy |
| 2011/0169082 A1 | 7/2011 | Zhu |
| 2011/0175170 A1 | 7/2011 | Wang |
| 2011/0180880 A1 | 7/2011 | Chudzik |
| 2011/0193164 A1 | 8/2011 | Zhu |
| 2011/0212590 A1 | 9/2011 | Wu |
| 2011/0230039 A1 | 9/2011 | Mowry |
| 2011/0242921 A1 | 10/2011 | Tran |
| 2011/0248352 A1 | 10/2011 | Shifren |
| 2011/0294278 A1 | 12/2011 | Eguchi |
| 2011/0309447 A1 | 12/2011 | Arghavani |
| 2012/0007194 A1 | 1/2012 | Sakakidani |
| 2012/0021594 A1 | 1/2012 | Gurtej |
| 2012/0034745 A1 | 2/2012 | Colombeau |
| 2012/0056275 A1 | 3/2012 | Cai |
| 2012/0065920 A1 | 3/2012 | Nagumo |
| 2012/0108050 A1 | 5/2012 | Chen |
| 2012/0132998 A1 | 5/2012 | Kwon |
| 2012/0138953 A1 | 6/2012 | Cai |
| 2012/0146148 A1 | 6/2012 | Iwamatsu |
| 2012/0146155 A1 | 6/2012 | Hoentschel |
| 2012/0167025 A1 | 6/2012 | Gillespie |
| 2012/0187491 A1 | 7/2012 | Zhu |
| 2012/0190177 A1 | 7/2012 | Kim |
| 2012/0223363 A1 | 9/2012 | Kronholz |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO 2011/062788 | 5/2011 |

OTHER PUBLICATIONS

Cheng, et al., "Extremely Thin SOI (ETSOI) CMOS with Record Low Variability for Low Power System-on-Chip Applications", Electron Devices Meeting (IEDM) (Dec. 2009).

Cheng, et al., "Fully Depleted Extremely Thin SOI Technology Fabricated by a Novel Integration Scheme Featuring Implant-Free Zero-Silicon-Loss, and Faceted Raised Source/Drain", Symposium on VLSI Technology Digest of Technical Papers, pp. 212-213 (2009).

Drennan, et al., "Implications of Proximity Effects for Analog Design", Custom Integrated Circuits Conference, pp. 169-176 (Sep. 2006).

Hook, et al., "Lateral Ion Implant Straggle and Mask Proximity Effect", IEEE Transactions on Electron Devices, vol. 50, No. 9, pp. 1946-1951 (Sep. 2003).

Hori, et al., "A 0.1 µm CMOS with a Step Channel Profile Formed by Ultra High Vacuum CVD and In-Situ Doped Ions", Proceeding of the International Electron Devices Meeting, New York, IEEE, US, pp. 909-911 (Dec. 5, 1993).

Matshuashi, et al., "High-Performance Double-Layer Epitaxial-Channel PMOSFET Compatible with a Single Gate CMOSFET", Symposium on VLSI Technology Digest of Technical Papers, pp. 36-37 (1996).

Shao, et al., "Boron Diffusion in Silicon: The Anomalies and Control by Point Defect Engineering", Materials Science and Engineering R: Reports, vol. 452, No. 3-4, pp. 65-114, Nov. 1, 2003 (Nov. 2012).

Sheu, et al., "Modeling the Well-Edge Proximity Effect in Highly Scaled MOSFETs", IEEE Transactions on Electron Devices, vol. 53, No. 11, pp. 2792-2798 (Nov. 2006).

Komaragirl, R. et al., "Depletion-Free Poly Gate Electrode Architecture for Sub 100 Nanometer CMOS Devices with High-K Gate Dielectrics", IEEE IEDM Tech Dig., San Francisco CA, 833-836 (Dec. 13-15, 2004).

Samsudin, K. et al., "Integrating Intrinsic Parameter Fluctuation Description into BSIMSOI to Forecast sub-15nm UTB SOI based 6T SRAM Operation", Solid-State Electronics (50), pp. 86-93 (2006).

Wong, H. et al., "Nanoscale CMOS", Proceedings of the IEEE, vol. 87, No. 4, pp. 537-570 (Apr. 1999).

Abiko, H. et al., "A Channel Engineering Combined with Channel Epitaxy Optimization and TED Suppression for 0.15µm n-n Gate CMOS Technology", 1995 Symposium on VLSI Technology Digest of Technical Papers, pp. 23-24 (1995).

Chau, R. et al., "A 50nm Depleted-Substrate CMOS Transistor (DST)", Electron Device Meeting 2001, IEDM Technical Digest, IEEE International, pp. 29.1.1-29.1.4 (2001).

Ducroquet, F. et al. "Fully Depleted Silicon-On Insulator nMOSFETs with Tensile Strained High Carbon Content Si1-yCy Channel", ECS 210th Meeting, Abstract 1033 (2006).

Ernst, T. et al., "Nanoscaled MOSFET Transistors on Strained Si, SiGe, Ge Layers: Some Integration and Electrical Properties Features", ECS Trans. 2006, vol. 3, Issue 7, pp. 947-961 (2006).

Goesele, U. et al., "Diffusion Engineering by Carbon in Silicon", Mat. Res. Soc. Symp. vol. 610, pp. 1-12 (2000).

Hokazono, A. et al., "Steep Channel & Halo Profiles and Utilizing Boron-Diffusion-Barrier Layers (Si:C) for 32 nm Node and Beyond", 2008 Symposium on VLSI Technology Digest of Technical Papers, pp. 112-113 (2008).

Hokazono, A. et al., "Steep Channel Profiles in n/pMOS Controlled by Boron-Doped Si:C Layers for Continual Bulk-CMOS Scaling", IEDM09-676 Symposium, pp. 29.1.1-29.1.4 (2009).

Holland, OW and Thomas, DK "A Method to Improve Activation of Implanted Dopants in SiC", Oak Ridge National Laboratory, Oak Ridge, TN, pp. 1-9 (2001).

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462 (1996).

Lavéant, P. "Incorporation, Diffusion and Agglomeration of Carbon in Silicon", Solid State Phenomena, vols. 82-84, pp. 189-194 (2002).

Noda, K. et al., "A 0.1-µm Delta-Doped MOSFET Fabricated with Post-Low-Energy Implanting Selective Epitaxy" IEEE Transactions on Electron Devices, vol. 45, No. 4, pp. 809-814 (Apr. 1998).

Ohguro, T. et al., "An 0.18-µm CMOS for Mixed Digital and Analog Applications with Zero-Volt-Vth Epitaxial-Channel MOSFET's", IEEE Transactions on Electron Devices, vol. 46, No. 7, pp. 1378-1383 (Jul. 1999).

(56) References Cited

OTHER PUBLICATIONS

Pinacho, R. et al., "Carbon in Silicon: Modeling of Diffusion and Clustering Mechanisms", Journal of Applied Physics, vol. 92, No. 3, pp. 1582-1588 (Aug. 2002).
Robertson, LS et al., "The Effect of Impurities on Diffusion and Activation of Ion Implanted Boron in Silicon", Mat. Res. Soc. Symp. vol. 610, pp. B5 8.1-B56 8.6 (2000).
Scholz, R. et al., "Carbon-Induced Undersaturation of Silicon Self-Interstitials", Appl. Phys. Lett. 72(2), pp. 200-202 (Jan. 1998).
Scholz, RF et al., "The Contribution of Vacancies to Carbon Out-Diffusion in Silicon", Appl. Phys. Lett., vol. 74, No. 3, pp. 392-394 (Jan. 1999).
Stolk, PA et al., "Physical Mechanisms of Transient Enhanced Dopant Diffusion in Ion-Implanted Silicon", J. Appl. Phys. 81(9), pp. 6031-6050 (May 1997).
Thompson, S. et al., "MOS Scaling: Transistor Challenges for the 21st Century", Intel Technology Journal Q3' 1998, pp. 1-19 (1998).
Wann, C., et al., "Channel Profile Optimization and Device Design for Low-Power High-Performance Dynamic Threshold MOSFET", IEDM 96, pp. 113-116 (1996).
Werner, P. et al., "Carbon Diffusion in Silicon", Applied Physics Letters, vol. 73, No. 17, pp. 2465-2467 (Oct. 1998).
Yan, Ran-Hong et. al., "Scaling the Si MOSFET: From Bulk to SOI to Bulk", IEEE Transactions on Electron Devices, vol. 39, No. 7, pp. 1704-1711 (Jul. 1992).

* cited by examiner

SLEW BASED PROCESS AND BIAS MONITORS AND RELATED METHODS

CROSS-REFERENCE TO RELATED APPLICATIONS

This application is a divisional of U.S. application Ser. No. 14/081,264 filed Nov. 15, 2013 and entitled "Slew Based Process and Bias Monitors and Related Methods" which claims the benefit of U.S. Provisional Application 61/726,968, entitled "Slew Based Process and Bias Monitors and Related Methods" filed on Nov. 15, 2012, and 61/739,991, entitled "Digital Pulse Extender Circuit and Related Methods", filed on Dec. 20, 2012, the entireties of which are hereby incorporated by reference.

TECHNICAL FIELD

The present invention relates generally to monitoring the performance of circuit elements in an integrated circuit device, and more particularly to using signal slew rate to monitor circuit element performance in response to variations in process and/or bias and/or supply voltage.

BACKGROUND

As process technology has scaled, it has become increasingly difficult to control the variation of transistor parameters because of a variety of factors, including, for example, Random Dopant Fluctuation (RDF). Other reasons for this variation include dopant scattering effect, such as the well proximity effect, that makes the placement of dopants in metal-oxide-semiconductor field effect transistors (MOSFETs) increasingly difficult as transistor size is reduced. Misplaced dopants can reduce transistor performance, increase transistor variability, including variability of channel transconductance, capacitance effects, threshold voltage, and leakage. Such variability increases as transistors are reduced in size, with each misplaced dopant atom having a greater relative effect on transistor properties, as a result of the overall reduction in the number of dopant atoms in the transistor.

Many integrated circuit (IC) devices use a variety of cells that perform specific functions. Integrated circuits can include logic, memory, controller and other functional blocks. Semiconductor integrated circuits are fabricated in a semiconductor process, often using a complementary MOS (CMOS) process. Transistors are formed in a semiconductor substrate, and usually involve a sequence of fabrication steps that result in a gate with adjacent source and drain, and a channel between the source and drain. Typically an IC device can include different transistor device types such as, p-channel MOS (PMOS) transistors, n-channel MOS (NMOS) transistors, MOSFETs tailored for digital or analog applications, high-voltage MOSFETs, high/normal/low frequency MOSFETs, MOSFETs optimized to work at distinct voltages or voltage ranges, low/high power MOSFETs, and low, regular, or high threshold voltage transistors (i.e., low Vt, regular Vt, or high Vt—also referred to as LVT, RVT, or HVT, respectively), etc. Transistor device types are usually distinguished by electrical performance characteristics (e.g., threshold voltage, speed, mobility, transconductance, linearity, noise, power), which can in turn lend themselves to be suitable for a particular application (e.g., signal processing, or data storage). Therefore, a complex IC device such as, for instance, a system on a chip (SoC), can use different transistor device types (or a combination of one or more different transistor types) to achieve the target performance for different circuit blocks in the IC.

The electrical performance characteristics of the different transistor device types in a SoC can be subject to variation due to manufacturing process variations, also referred to as the "manufacturing corner" of a particular transistor device. Typically, the electrical performance variation of the different transistor device types of the SoC can be different because the performance of each transistor device type is impacted differently by the manufacturing process variations.

DETAILED DESCRIPTION

Various embodiments will now be described with reference to a number of drawings. Embodiments can include process monitor circuits that can be used to determine the electrical performance variation of circuit elements that can arise from manufacturing process variations and/or bias conditions. In some embodiments such circuit elements can include transistors, and in particular embodiments can include insulated gate field effect transistors, referred to herein as metal-oxide-semiconductor (MOS) transistors, but not implying any particular gate insulator material(s). The drawings depict various embodiments for the purposes of illustration only and are not intended to be limiting. One skilled in the art will readily recognize from the following description that various embodiments of the structures and methods illustrated herein may be employed without departing from the general principles of the embodiments described herein.

Figure 1A:
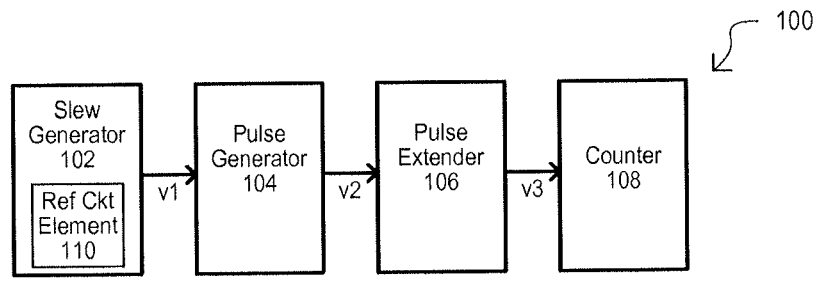
FIG. 1A is a functional block diagram of a process monitor circuit that can be included in an integrated circuit (IC) device according to an embodiment.

FIG. 1A shows a functional block diagram of a process monitor circuit 100 that can be included in an integrated circuit (IC) device, in accordance with an embodiment. A process monitor circuit 100 can include a slew generator circuit 102, a pulse generator circuit 104, a pulse extender circuit 106, and a pulse evaluator 108. A slew generator 102 can generate a slew rate signal v1 having a slew rate that can vary in response to one or more characteristics of reference circuit elements. Such characteristics can be with reference to process "corners", which can represent process conditions that result in performance extremes of the circuit element(s).

In some embodiments, a reference element 110 can be a reference transistor. A reference transistor can be designed to be representative of one or more groups of transistors included on the integrated circuit device (e.g., included in other circuits that provide predetermined functions). A slew generator circuit 102 can thus use any of a number of different transistors to generate a signal having a slew rate that varies according to the reference transistor 110. For example, slew generators can use low threshold voltage (LVT), standard threshold voltage (SVT), or high threshold voltage (HVT) transistor types as a reference transistor (e.g., 110) in a process monitor circuit (e.g., 100) to monitor the performance of such transistor types. In addition, the a reference transistor (e.g., 110) can be either an n-channel MOS (NMOS) or p-channel (MOS) device, and therefore, the slew monitor and process monitor can monitor the performance of NMOS and PMOS transistors independently.

Referring to FIG. 1A, a slew rate of the signal v1 can be used to determine the speed and power variation of the one or more group of transistors corresponding to the reference transistor (which is representative of the group of transistors), in the presence of manufacturing process variations. In one embodiment, an integrated circuit can include more than one process monitor circuit (e.g., 100), where each process monitor circuit includes a slew rate based process monitor circuit that can determine the speed and power variation of a different group of transistors. For example, a first slew monitor circuit can be used to determine the process corner of PMOS transistors on the IC and a second slew monitor can be used to determine the process corner of NMOS transistors on the IC.

A process monitor circuit 100 can use pulse generator circuit 104 to generate monitor data that corresponds to the slew rate of the signal v1 generated by the slew generator circuit 102. Pulse generator circuit 104 may include a ratioed current mirror between PMOS and NMOS transistors, to receive a launch signal to generate a P and N slew, whereupon the slews feed into a selector to charge a capacitor which may discharge to generate a pulse. Such monitor data can be used as a performance measure of the reference circuit element 110 (e.g., reference transistor). The pulse generator circuit 104 can receive slew rate signal v1 and generate a pulse signal v2 having a pulse, where the duration of the pulse corresponds to the slew rate of the slew rate signal v1. In one embodiment, the duration of a pulse in signal v2 can correspond to the time it takes the slew rate signal v1 to transition from a first voltage to a second voltage. Thus, a pulse width of a pulse in signal v2 can be used to determine the speed and power variation of the reference circuit element 110.

A pulse extender circuit 106 can receive the pulse signal v2 and generate an extended pulse signal v3, which can have an extended pulse with a duration that is proportional to the duration of the pulse provided by pulse signal v2. Typically, the extended pulse has a longer duration than the duration of the pulse of signal v2, and therefore, the duration of the extended pulse can be measured with greater accuracy than the pulse present in pulse signal v2. Because the duration of the extended pulse of signal v3 is proportional to that of signal v1, the extended pulse also varies in response to the manufacturing corner of the reference circuit element 110. Accordingly, the extended pulse can also be used to determine the speed and power variation of the group of transistors that correspond to the reference circuit element 110.

A pulse evaluator 108 can generate a value corresponding to the duration of the extended pulse of signal v3. In particular embodiments, a pulse evaluator 108 can be a counter circuit that measures the duration of the extended pulse by counting while the pulse is active. In one embodiment, an extended pulse signal v3 can be connected to an enable input of a counter circuit, such that the counter circuit increments only when the enable input is asserted. The counter can then increment a count in response to each pulse of a counting clock signal as long as the extended pulse is active. In some embodiments, a counting clock signal can be a system clock. A resulting count value can be a measure of the duration of the extended pulse of signal v3.

Figure 1B:
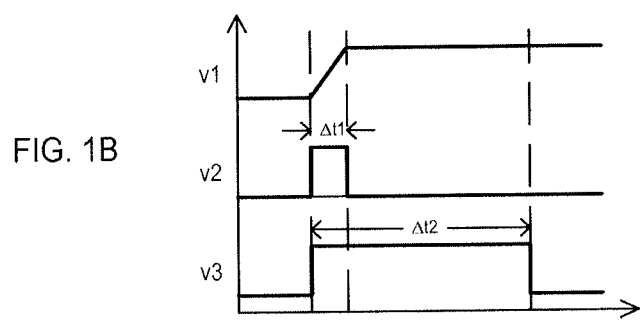
FIG. 1B is a timing diagram showing an operation of a processor monitor circuit like that of FIG. 1A.

FIG. 1B is a timing diagram that illustrates the operation of process monitor circuit, like that of FIG. 1A, according to a particular embodiment. FIG. 1B shows a slew rate signal v1 (which can be generated by a slew generator circuit 102), a pulse signal v2 (which can be generated by pulse generator 104), and an extended pulse signal v3 (which can be generated by pulse extender circuit 106). In the embodiment shown, the slew rate signal transitions from a first level to a second level over a time interval $\Delta t1$ that depends on the performance characteristics of a reference circuit element. The pulse voltage signal v2 includes a pulse that corresponds to the slew rate, and in the embodiment shown can be $\Delta t1$. The extended pulse of signal v3 can have an extended duration $\Delta t2$, where the ratio between $\Delta t2$ and $\Delta t1$ can have a predetermined value. It is understood that any of signals v1, v2 and/or v3 can represent a signal voltage or current.

Figure 1C:
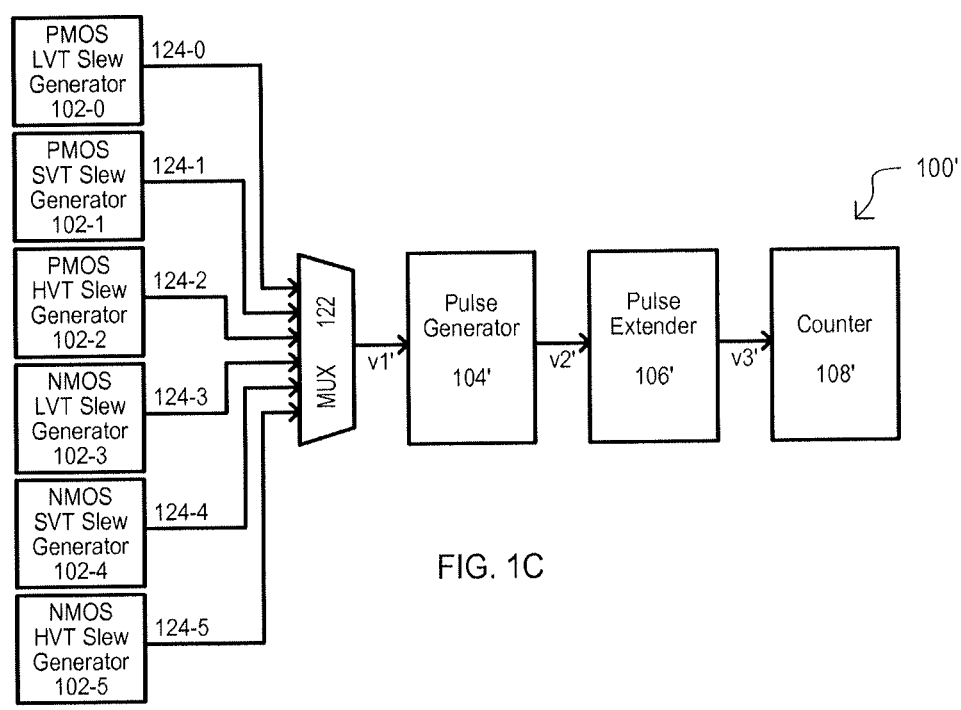
FIG. 1C is a functional block diagram of a process monitor circuit that can be included in an IC device according to another embodiment.

FIG. 1C is a functional block diagram of a process monitor circuit 100' that can be included in an IC device, in accordance with another embodiment. The process monitor circuit 100' can include slew generator circuits 102-0 to 102-5, a monitor selection multiplexer (MUX) 122, pulse generator circuit 104', pulse extender circuit 106', and pulse evaluator 108'. Slew generator circuits (102-0 to 102-5) can each generate one or more signals having slew rates that correspond to different reference circuit element types. In the particular embodiment shown, slew generator circuits 102-0 to 102-5 utilize as a reference circuit elements a low threshold voltage (LVT) PMOS transistor, a standard threshold voltage (SVT) PMOS transistor, a high threshold voltage (HVT) PMOS transistor, a LVT NMOS transistor, a SVT NMOS transistor, and a HVT NMOS transistor, respectively. It is understood that each of slew generator circuits (102-0 to 102-5) can use one or more of the reference transistors to establish the slew of its respective slew rate signal.

In a particular embodiment, each slew generator circuit (102-0 to 102-5) can include a reference transistor of the type that is being monitored by the respective slew generator. For example, the PMOS LVT slew generator circuit 102-0 can use a PMOS SVT reference transistor, the NMOS LVT slew generator can use an NMOS LVT reference transistor, etc. Slew generator circuits (102-0 to 102-5) generate slew rate signals 124-0 to 124-5, respectively. A slew rate of each slew rate signal (124-0 to 124-5) can vary in response to the as fabricated "manufacturing corner" of a corresponding reference transistor of the respective slew generator.

Multiplexer 122 can selectively connect one of the slew generator outputs signals (124-0 to 124-5) as an input signal v1' to the input of the pulse generator circuit 104' in response to a select value SLEW_SELECT. Pulse generator circuit 104', pulse extender circuit 106', and pulse evaluator 108' can operate in the same, or an equivalent fashion as 104, 106 and 108 of FIG. 1A. Therefore, in the embodiment of FIG. 1C, pulse generator circuit 104', the pulse extender circuit 106', and pulse evaluator 108' can be shared across multiple slew generator circuits (e.g., slew generator circuits (102-0 to 102-5), thereby reducing the area of the process monitor circuit.

Figure 2A:
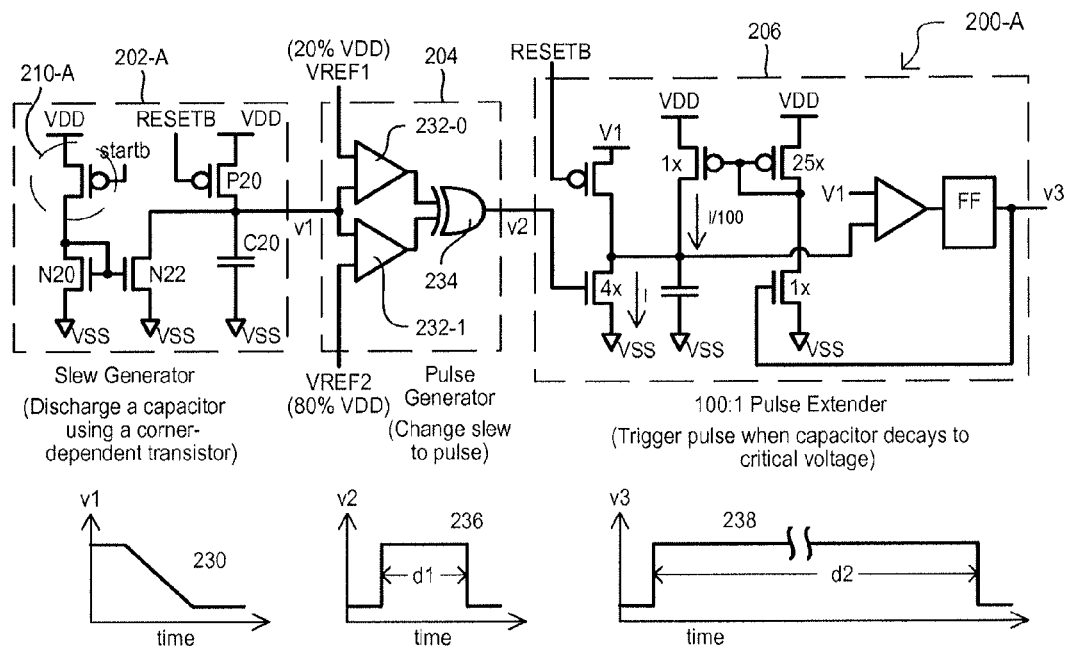
FIG. 2A shows a block schematic and timing diagrams of a process monitor circuit that determines the performance of a reference p-channel insulated gate field effect transistor (e.g., PMOS transistor) according to an embodiment.

FIG. 2A is a block schematic diagram of a process monitor circuit 200-A that can determine the performance of a PMOS transistor, in accordance with an embodiment. A process monitor circuit 200-A can include a slew generator circuit 202-A, a pulse generator circuit 204, and a pulse extender circuit 206. Slew generator circuit 202-A can generate a signal v1 having a voltage with a slew rate that varies according to performance variation in a PMOS reference transistor 210-A. In the particular embodiment shown, slew generator circuit 202-A can include the PMOS reference transistor 210-A, a current mirror N20/N22, a load capacitor C20, and a reset device P20. A current mirror N20/N22 can mirror a current drawn by PMOS reference transistor 210-A. A reset device P20, which is a PMOS device in the embodiment shown, can charge load capacitor C20 to a predetermined level.

An operation of slew generator circuit 202-A will now be described. A reset signal "RESETB" can be activated (transition low), causing reset device P20 to charge load capacitor C20 to an initial voltage. Signal "RESETB" can then return to a high level to turn off reset device P20. A start signal "start" can then be activated, causing PMOS reference transistor 210-A to set the magnitude of a reference current provided to current mirror N20/N22. Typically, manufacturing process variations can result in a PMOS reference transistor that is slower or faster (e.g., provides more or less drain current) as compared to a nominal transistor. Current mirror N20/N22 can discharge load capacitor with a current that mirrors the reference current provided by PMOS reference transistor 210-A. Therefore, a load capacitor C20 discharge time can vary in response to the process variations affecting PMOS reference transistor 210-A.

Process monitor circuit 200-A can measure the slew rate of the voltage across the capacitor (i.e., the slew voltage signal v1) which corresponds to a discharge time of the load capacitor C20. As understood from above, a measured variation of the discharge time of load capacitor C20 is also a measure of the manufacturing process variation, and process corner of the PMOS reference transistor 210-A.

Graph 230, positioned below slew generator circuit 202-A in FIG. 2A, shows one example of a signal v1, corresponding to the slew rate of the voltage across load capacitor C20. As shown, signal v1 can be at an initial voltage, and in response to the activation of signal "start" can fall as load capacitor C20 is discharged.

Referring still to FIG. 2A, a slew rate signal v1 output from slew generator circuit 202-A can be received by pulse generator circuit 204. Pulse generator circuit 204 can generate a pulse signal v2 having a pulse signal that is active (e.g., high) while signal v1 is between two reference levels, and low when signal v1 is outside of the reference levels. In the particular embodiment shown, pulse generator circuit 204 can include a first comparator 232-0, second comparator 232-1, and logic 234. Comparators (232-0/1) can sense slew rate signal v1 as the load capacitor C20 is discharging. In the embodiment shown, second comparator 232-1 can be triggered when the slew voltage signal v1 falls below a second comparator reference voltage VREF2 (e.g., 80% of VDD). A first comparator 232-0 can be triggered (i.e., the output of the comparator transitions from a low to a high voltage level) when the slew rate signal v1 falls below a first comparator reference voltage VREF1 (e.g., 20% of a high power supply voltage VDD). A time interval between the triggering of the first and second comparators, i.e., the time interval between the slew rate signal v1 falling from VREF2 to VREF1, is converted into a pulse by logic 234, which is an XOR logic gate in the embodiment shown.

Graph 236, positioned below pulse generator circuit 204 in FIG. 2A, shows one example of a signal v2, corresponding to a pulse output from logic 234. As shown, signal v2 can have a pulse of duration of d1.

A pulse extender circuit 206 can extend the duration of a pulse in signal v2 to generate an extended pulse in a signal v3, where the extended pulse has a longer duration that can be measured with enhanced accuracy. In one embodiment, a pulse extender circuit 206 can extend the duration of the pulse in signal v2 by approximately 100 times in order to create a more easily measured time interval. The operation of various pulse extender circuits (e.g., 206) will be described in more detail below in conjunction with FIGS. 3A/B and 8.

Though not shown in FIG. 2A, in some embodiments, a digital counter can count the number of pulses of a clock signal that occur while the extended pulse is active. Such a clock signal can be generated on the IC device (e.g., by a clock generator) or can be supplied from a source external to the IC device (e.g., by external test equipment).

Graph 238, positioned below pulse extender circuit 206 in FIG. 2A, shows one example of a signal v3, corresponding to a signal v3 output by the pulse extender circuit. Signal v3 can have an extended pulse of duration of d2, where d2>d1.

Figure 2B:
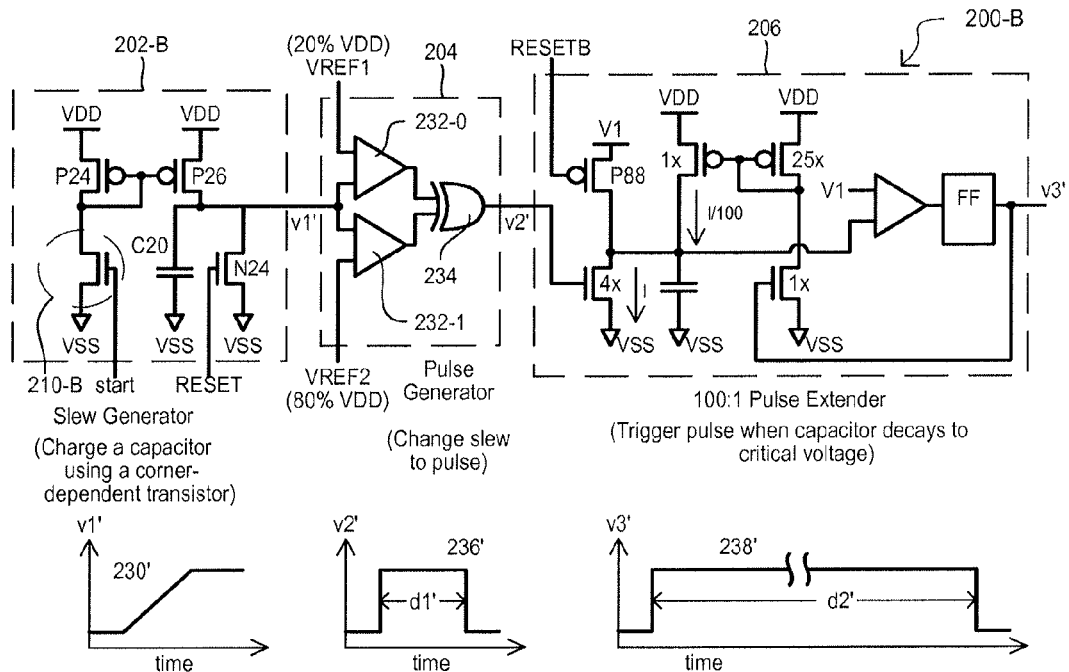
FIG. 2B shows a block schematic and timing diagrams of a process monitor circuit that determines the performance of a reference n-channel insulated gate field effect transistor (e.g., NMOS transistor) according to an embodiment.

FIG. 2B shows a process monitor circuit 200-B that can determine the performance of an NMOS transistor, in accordance with one embodiment. Process monitor circuit 200-B can include a slew generator circuit 202-B, a pulse generator circuit 204, and a pulse extender circuit 206. Slew generator circuit 202-B can generate a signal v1' having a voltage with a slew rate that varies according to performance variation in a NMOS reference transistor 210-B. In the particular embodiment shown, slew generator circuit 202-B can include the NMOS reference transistor 210-B, a current mirror P24/P26, a load capacitor C20, and a reset device N24. A current mirror P24/P26 can mirror a current drawn by PMOS reference transistor 210-A. A reset device N24, which is a NMOS device in the embodiment shown, can discharge load capacitor C20 to a predetermined level.

An operation of slew generator circuit 202-B will now be described. A reset signal "RESET" can be activated (transition high), causing reset device N24 to discharge load capacitor C20 to an initial voltage. Signal "RESET" can then return to a low level to turn off reset device N24. A start signal "start" can then be activated, causing NMOS reference transistor 210-B to set the magnitude of a reference current drawn from current mirror P24/P26. Typically, manufacturing process variations can result in a NMOS reference transistor that is slower or faster (e.g., provides more or less drain current) as compared to a nominal transistor. Current mirror P24/P26 can charge load capacitor C20 with a current that mirrors the reference current drawn by NMOS reference transistor 210-B. Therefore, a load capacitor C20 charge time can vary in response to the process variations affecting NMOS reference transistor 210-A.

Process monitor circuit 200-B can measure the slew rate of the voltage across the capacitor (i.e., the slew voltage signal v1') which corresponds to a charge time of the load capacitor C20. As understood from above, a measured variation of the charge time of load capacitor C20 is also a measure of the manufacturing process variation, and process corner of the NMOS reference transistor 210-A.

Graph 230', positioned below slew generator circuit 202-B in FIG. 2B, shows one example of a signal v1', corresponding to the slew rate of the voltage across load capacitor C20. As shown, signal v1' can be at an initial voltage, and in response to the activation of signal "start" can rise as load capacitor C20 is charged.

Referring still to FIG. 2B, a slew rate signal v1' output from slew generator circuit 202-B can be received by pulse generator circuit 204. Pulse generator circuit 204 can operate like that of FIG. 2A, generating a pulse signal v2 having a pulse signal that is active (e.g., high) while signal v1' is between two reference levels, and low when signal v1' is outside of the reference levels. In the embodiment shown, first comparator 232-0 can be triggered (i.e., the output of the comparator transitions from a low to a high voltage level) when the slew rate signal v1' rises to a first comparator reference voltage VREF1 (e.g., 20% of a high power supply voltage VDD). Second comparator 232-1 can be triggered when the slew voltage signal v1' rises to a second comparator reference voltage VREF2 (e.g., 80% of VDD). A time interval between the triggering of the first and second comparators, i.e., the time interval between the slew rate signal v1' rising from VREF1 to VREF2, is converted into a pulse by logic 234, which is an XOR logic gate in the embodiment shown.

Graph 236', positioned below pulse generator circuit 204 in FIG. 2B, shows one example of a signal v2', corresponding to a pulse output from logic 234. As shown, signal v2' can have a pulse of duration of d1'.

A pulse extender circuit 206 can operate in the same or equivalent manner as that shown as 206 in FIG. 2A. Further, though not shown in FIG. 2B, in some embodiments, a digital counter can count the number of pulses of a clock signal that occur while the extended pulse is active, as noted above.

Graph 238', positioned below pulse extender circuit 206 in FIG. 2B, shows one example of a signal v3', corresponding to a signal v3' output by the pulse extender circuit. As shown, signal v3 can have an extended pulse of duration of d2', where d2'>d1'.

Figure 2C:
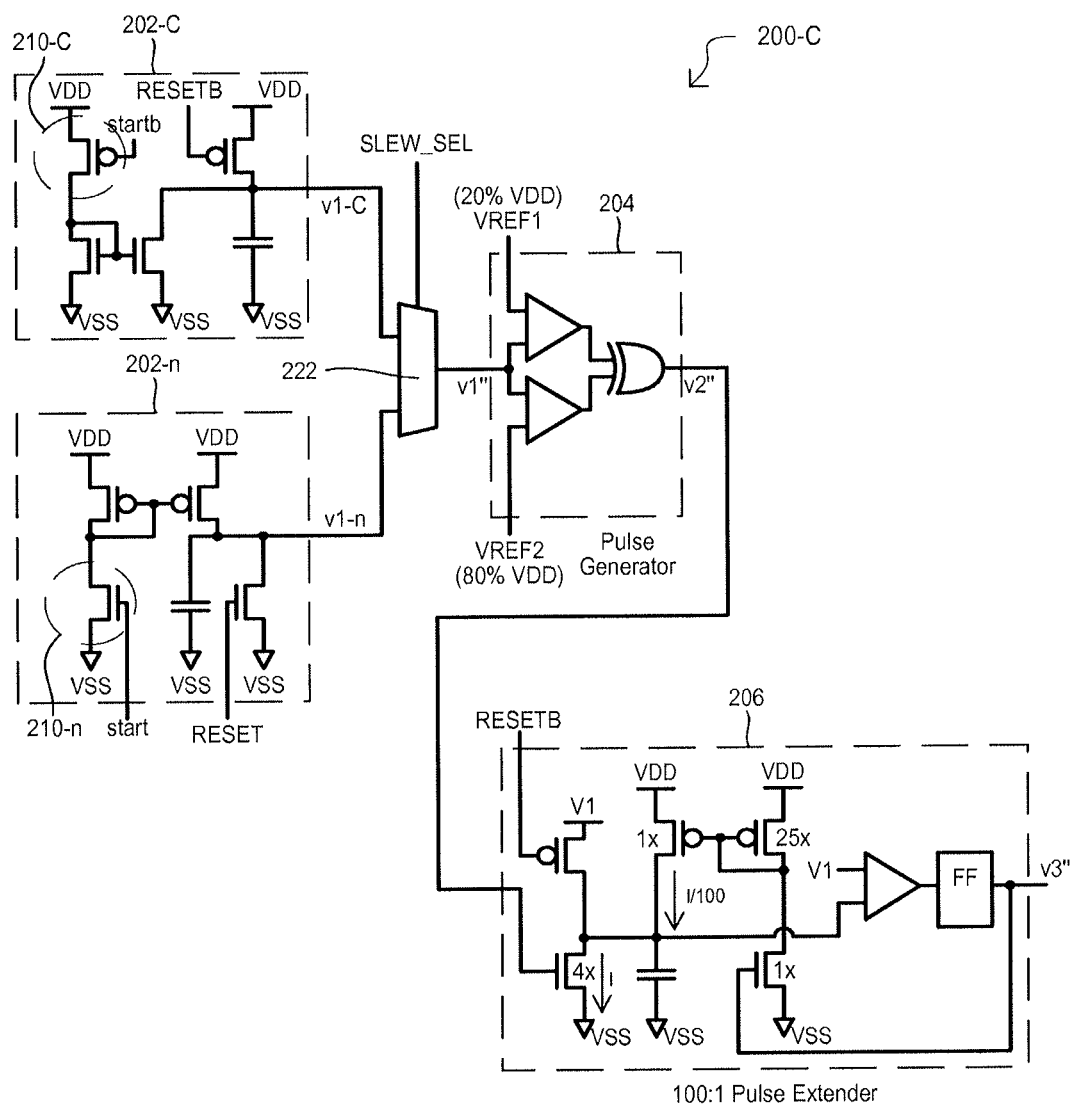
FIG. 2C shows a block schematic and timing diagram of a process monitor circuit that can select between different reference devices according to an embodiment.

FIG. 2C shows a process monitor circuit 200-C that can determine the performance of different transistor types, including transistors of different conductivity types. Process monitor circuit 200-C can include multiple slew generator circuits (two shown as 210-C and 210-n), each including a different reference transistor (e.g., 210-C and 210-n). In the particular embodiment shown, process monitor circuit 200-C can include a slew generator circuit 202-C that determines the performance of a PMOS reference transistor 210-C and a slew generator circuit 202-n that determines the performance of a NMOS reference transistor 210-n.

Slew rate signals v1-C and v1-n output from the slew generator circuits (e.g., 210-C and 210-n) can have slew rates that vary according to their reference circuit element (e.g., NMOS or PMOS transistors) performance variations. A MUX 222 can selectively connect one of the slew rate signals (e.g., v1-0 and v1-n) to a pulse generator 204.

A pulse generator circuit 204 and pulse extender circuit 206 can operate in the same or equivalent manner as that shown as 204 and 206 in FIG. 2A. Further, though not shown in FIG. 2C, in some embodiments, a digital counter can count the number of pulses of a clock signal that occur while the extended pulse is active, as noted above.

A charging or discharging time of a load capacitor as described herein can be extended to enhance the accuracy of a process monitor measurement. In one embodiment, a 'typical' target for the load capacitor charging/discharging time can be about 40 ns, although charging/discharging times can vary due to manufacturing process variation. A charging/discharging time that is too short can make it more difficult to design comparators (e.g., 232-0/1) within pulse generator circuits (e.g., 204), as they must be fast and precise enough to capture the signal slew. Additionally, since an output of a pulse generator circuit (e.g., 204) can charge a capacitor within a pulse extender circuit (e.g., 206), a very short pulse may not inject enough charge into the capacitor of the pulse extender circuit (e.g., 206) to generate an extended pulse of sufficient duration for accurate measurement by a counter circuit, or the like.

Hence, an extended load capacitor charging time can reduce the area required to implement a process monitor circuit, and increase the accuracy of the process monitor measurement (e.g., measured duration of a pulse or extended pulse).

According to some embodiments, a load capacitor charging/discharging time is extended by reducing the current that charges/discharges the load capacitor, (e.g., a current mirrored current by a current mirror N22/N24, P24/P26). One method of reducing the mirrored current can be to reduce the reference current of the current mirror, i.e., the current flowing through the reference transistor (e.g., 210-A/B). A mirrored current can be reduced by setting the relative transistor sizes of the current mirror (i.e., the width to length ratios of the two transistors) such that the current flowing through the load capacitor (i.e., the mirrored current) is a small fraction of the reference current for the current mirror. Reducing the mirrored current can also be used in certain embodiments to reduce the size of the load capacitor while still maintaining an acceptable capacitor charging time that can be accurately measured by the process monitor.

In certain embodiments, the reference current is also reduced by implementing the reference transistor (e.g., 210-NB) as a minimum channel length transistor composed of many fingers. A minimum length transistor can be a length substantially similar to the channel length used for logic transistors in the same IC. Such a reference transistor can provide a reduced reference current that is substantially insensitive to random process variations. In addition or alternatively, a current mirror (N22/N24, P24/P26) can be implemented using transistors that are substantially insensitive to process variation, and the two transistors can be sized to provide a mirrored current that is a small fraction of the reference current.

Figure 3A:
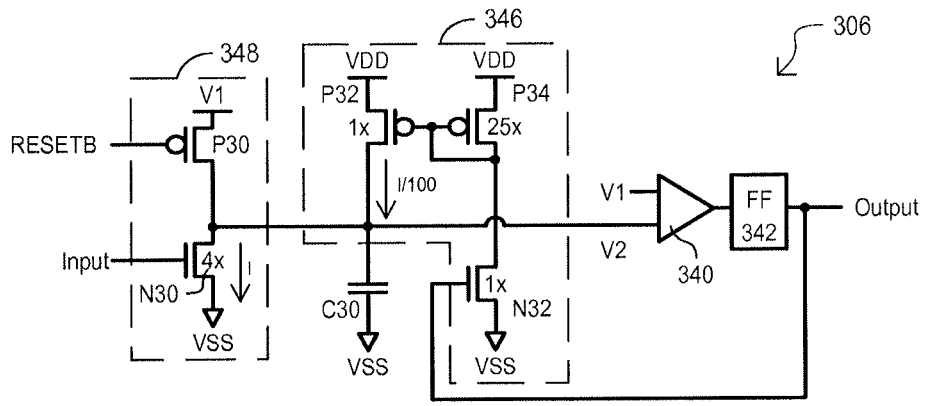
FIG. 3A is a block schematic diagram of a pulse extender circuit according to an embodiment.

FIG. 3A shows a pulse extender circuit 306, in accordance with an embodiment. A pulse extender circuit 306 can be one version of those shown as 206 in FIGS. 2A to 2C. A pulse extender circuit 306 can include an extender capacitor C30, an input-to-voltage integrator 346, a proportional discharge circuit 348, a comparator 340, and logic 342. An input-to-voltage integrator 346 can provide a fixed current (I/100) to charge capacitor C30. In the embodiment shown, input-to-voltage integrator 346 can include a current mirror P32/P34 and an enable device N32. Current mirror P32/P34 can have one leg connected to capacitor C30 and the other connected to enable device N32. The PMOS transistor P32 of the current mirror P32/P34 which supplies current to capacitor C30 can be substantially smaller than the other PMOS transistor P34, to provide a relatively small, but accurate current to capacitor C30. Enable device N32 can enable the current mirror P32/P34 in response to the output of logic 342.

Proportional discharge circuit 348 can discharge capacitor C30 by an amount proportional to an input signal pulse duration. Thus, the amount by which capacitor C30 is discharged can reflect the performance of a reference circuit element, such as a PMOS or NMOS transistor, as described herein, or equivalents. In the embodiment shown, proportional discharge circuit 348 can include a discharge device N30 and a reset device P30. A discharge device N30 can be an NMOS transistor with a source-drain path connected between capacitor C30 and a low voltage (e.g., low power supply voltage VSS), and a gate that receives an input pulse (Input) (such as an input pulse from a pulse generator circuit as described herein, or an equivalent). A reset device P30 can be a PMOS transistor having a source-drain path connected between a high voltage (e.g., a high reference voltage V1) and capacitor C30, and a gate that receives a reset pulse. A current sunk by discharge device N30 can be substantially greater than that provided by input-to-voltage integrator 346. In the particular embodiment shown, a current sunk by discharge device N30 can be I, i.e., 100× that provided by the current mirror P32/P34.

Comparator 340 can compare the voltage across the capacitor C30 (shown as V2) to the high reference voltage V1. Thus, when V2<V1, the comparator 340 can have an active output value. When V2>V1, the comparator 340 can have an inactive output. In response to an active output from comparator 340, logic 342 can generate an output value "Output" that is high, enabling input-to-voltage integrator 346. In one particular embodiment, logic 342 can be a flip-flop circuit.

Figure 3B:
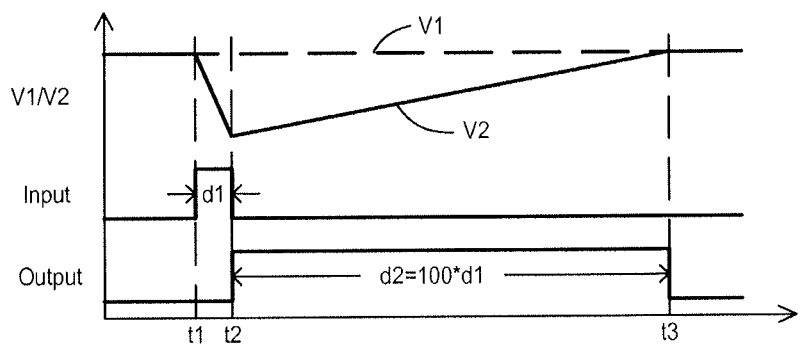
FIG. 3B is a timing diagram showing an operation of a pulse extender circuit like that of FIG. 3A.

FIG. 3B is a timing diagram showing an operation of a pulse extender circuit like that of FIG. 3A. FIG. 3B includes the waveforms V1 (reference input to comparator 340), V2 (voltage across capacitor C30), Input (input signal to discharge device N30) and Output (output signal from logic 342).

Referring still to FIG. 3B, prior to time t1, by operation of reset device P30, capacitor C30 can be charged to a voltage V1.

At time t1, signal Input can pulse high. As a result, a voltage of capacitor C30 can start to discharge.

A pulse duration of input signal Input can be d1. Thus, at time t2, the pulse ends, and discharge device N30 turns off. The amount by which capacitor C30 discharges is thus proportional to the duration d1. As will be recalled, d1 can reflect the performance of a reference circuit element (e.g., transistor) thus, V1-V2 corresponds to a performance value of the reference circuit element.

At about time t2, in response to the difference between V1 and V2, comparator 340 can activate its output and logic 342 can set the value of Output high, starting the extended pulse. Input-to-voltage integrator 346 can be enabled, and thus start to charge C30 back toward V1.

At about time t3, by operation of input-to-voltage integrator 346, voltage V2 on capacitor can charge back up to about V1. Comparator 340 can deactivate its output and logic 342 can set the value of Output low, terminating the extended pulse. Input-to-voltage integrator 346 can be disabled.

As will be recalled, the charge current provided by current mirror P32/P34 can be 1/100 of the original pulse current provided by discharge device N30. Since the charge current is set to 1/100 of the discharging current, the extended pulse output from logic 342 can be 100 times the pulse width of the original pulse on signal Input. It is noted that the 100× proportionality can depend on the matching of current mirrors, and not the actual values of the currents or capacitance. As such, this proportionality is not affected very much by process corner.

It is noted from the figure that the capacitor discharge time for discharging from a first predetermined voltage V2 to a second voltage in response to the input voltage pulse is shorter than the time duration for charging the capacitor to the first predetermined voltage V1. Thus, the output pulse has an extended duration (d2) with respect to the duration of the input pulse (d1). Because the discharge current is proportional to the charge current (e.g., I:I/100), the duration of the output pulse can be proportional to the duration of the input pulse (e.g., d2=100*d1).

It is understood that while the pulse extender circuit of FIGS. 3A/B show the generation of an extended pulse based on an initial discharge and subsequent charging of a capacitor, alternate embodiments can be based on an initial charge and subsequent discharge of a capacitor.

Figure 4:
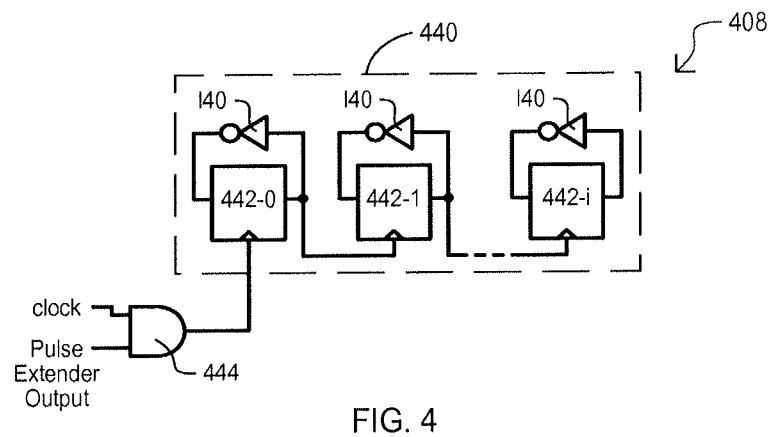
FIG. 4 is a block schematic diagram of a counter circuit that can be included in embodiments.

FIG. 4 is a block schematic diagram of a counter circuit 408, in accordance with one embodiment. A counter circuit 408 can be one particular implementation of a pulse evaluator circuit, like that shown as 108 in FIG. 1A. According to embodiments, an output of a pulse generator circuit or a pulse extender circuit can act as an enable input to a counter circuit 408. Counter circuit 408 can increment a count value every time there is a pulse in a counting clock signal, as long as an input pulse is active. In the very particular embodiment shown, a counter circuit 408 can include counter 440 and control logic 444. Counter 440 can include flip flops 442-0 to 442-i with corresponding inverters (140) arranged in series, with each flip flop (442-0 to 442-i) representing a bit of a count value.

Logic 444 can generate pulses as clock inputs to a least significant bit flip flop 442-0. As noted above, as long as an extended pulse input (Pulse Extender Output) is active (high in the example shown), logic 444 can generate a pulse corresponding to each pulse of CLK_CNT. Thus, a resulting count value stored by counter 440 can correspond to a duration of the pulse from Pulse Extender Output.

A typical clock available from test equipment used during manufacturing test can be 25 MHz. Given a 40 ns typical pulse width, and a 100× extension of the pulse width, a 25 MHz clock can generate a count of 100 for a typical corner. In some embodiments, a count value generated by a counter circuit (e.g., 408) can be read using a scan chain or a register interface.

Various embodiments of the process monitor circuits described herein, and equivalents, can be advantageously used to measure the variation of performance characteristics of integrated circuit devices in the presence of manufacturing process variations. Such process monitor circuits can advantageously provide a digitally readable measurement that allows process variation measurements without the use of special test equipment. The digital measurements provided by such process monitors can be read out without using any additional pins (e.g., using a scan chain or a register interface logic), and the digital measurements can be performed during normal operation of the integrated circuit and during power up.

Process monitor circuits described herein, and equivalents, can also be used to measure the variation of PMOS and NMOS transistors separately, and therefore, can enable independent determination of the PMOS and NMOS transistor manufacturing process corners. Process monitor circuits as described herein, or equivalents, can also be used to measure the variation of different transistor types separately, e.g., the manufacturing corners of LVT, SVT, and HVT transistors can be independently determined by using process monitors having a representative LVT, SVT, and HVT transistor respectively. In addition, the process monitor circuits as described herein, or equivalents, can be substantially insensitive to random variations of transistor performance characteristics, such as random dopant fluctuation, which can skew the process monitor measurements and introduce errors in determining the systematic manufacturing process variations. Advantageously, the process monitors described above can be used to determine process corners during a manufacturing test, since the process monitor measurement can be performed in a short time.

While embodiments can include process monitor circuits, other embodiments can include body bias control circuits for an IC device that use such process monitor circuits. In such embodiments, a body bias control circuit can adjust the body bias voltage for one or more groups of transistors in an IC device to provide a predetermined target transistor performance in the presence of manufacturing process variations. Such body bias control circuits can use the process monitor circuits described herein, or equivalents, to determine the manufacturing process corner and to adjust the body bias voltage to compensate for resulting transistor performance variations. For example, performance data generated by such process monitor circuits can be used to measure the transistor speed variation resulting from manufacturing process variations, and the body bias voltage can be adjusted in response to the monitor data to obtain a target transistor speed. In one embodiment, the target transistor speed is used to determine a target monitor data value, and the body bias voltage is adjusted until the monitor data measured by the process monitor is substantially equal to the target monitor data value.

In some embodiments, such process monitor circuits as described herein, or equivalents, can be used as part of a continuous feedback system, where such a process monitor circuit is used as a body bias monitor that monitors transistor performance as the body bias voltage is adjusted to achieve target transistor performance in order to compensate for manufacturing process variations. Such process monitor circuits preferably have a smooth and predictable response to body bias voltage.

Figure 5A:
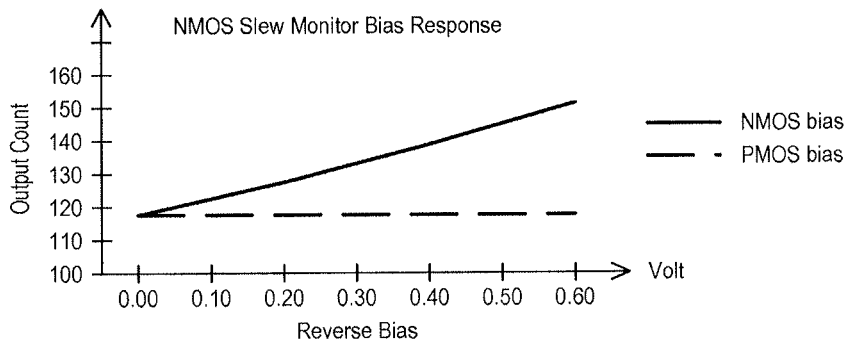
FIGS. 5A and 5B are graphs showing the relationship between transistor performance and reverse body bias.

FIG. 5A is a graph showing an NMOS process monitor circuit response, according to an embodiment, where the process monitor circuit utilizes an NMOS reference transistor. FIG. 5A shows a resulting output count (i.e., extended pulse width duration) for various reverse body bias voltages. It is noted from the figure that the response to NMOS bias voltage is substantially smooth and linear, while the response to the PMOS bias voltage is substantially zero.

Figure 5B:
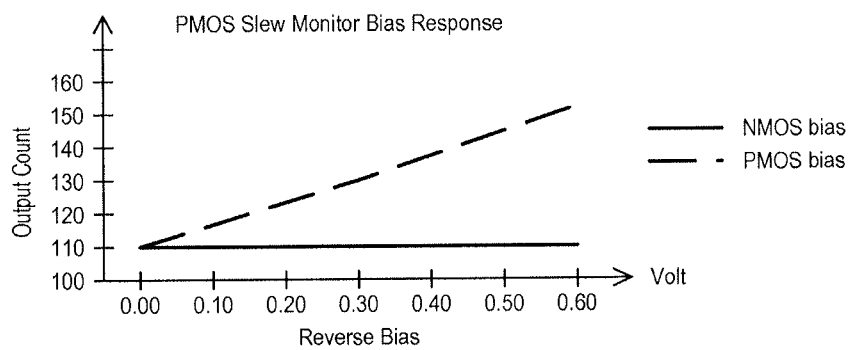

FIG. 5B is a graph showing a PMOS process monitor circuit response, according to an embodiment, where the process monitor circuit utilizes a PMOS reference transistor. FIG. 5B shows a resulting output count (i.e., extended pulse width duration) for various reverse body bias voltages. It is noted from the figure that the response to PMOS bias voltage is substantially smooth and linear, while the response to the NMOS bias voltage is substantially zero.

Thus, process monitor circuits, as described herein and equivalents, can be used to independently adjust body bias voltages for NMOS and PMOS transistors to compensate for transistor performance variations. In alternative embodiments, such process monitor circuits can also be used to monitor transistor performance and compensate for transistor performance due to other factors, such as operating temperature, aging of the IC device. In some embodiments, such monitoring can be continuous during the operation of the IC. More specifically, although the descriptions herein are in the context of monitoring performance variation in transistors due to manufacturing process-related effects, the same circuits in the embodiments or the equivalents can be used to monitor performance variation due to any appropriate cause. It is to be noted that the nomenclature "process monitor" can refer generally to monitoring circuits that identify transistor performance characteristics that may be a result of process drifts or other factors that may affect transistor performance. "Process monitor" is not limited to a circuit that monitors variations arising from semiconductor processing. "Process corner" is not limited to semiconductor process-related characteristics. Rather, "process corner" is any characterization of a transistor performance in a given context, whether speed, leakage or other characteristic arising from anything that can cause a variation in transistor performance from nominal.

As described above, the PMOS and NMOS process monitor circuits according to embodiments, and equivalents, can be used to determine the process corner of the PMOS and NMOS reference transistors that are used by the respective process monitor circuits. Such operations are represented by graphs in FIGS. 6A and 6B.

Figure 6A:
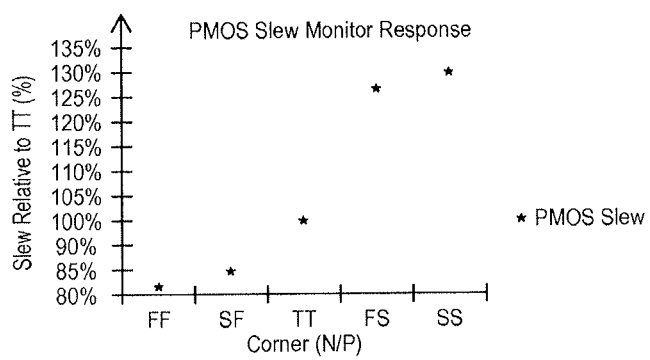
FIGS. 6A and 6B are graphs showing the relationship between transistor performance and process variation.

FIG. 6A is a graph showing how a PMOS process monitor circuit response can be used to determine the manufacturing process corner of the reference PMOS transistor. The vertical axis of the graph shows the "relative slew rate to TT" (hereinafter referred to as "relative PMOS slew rate"), which is measured as the ratio of the slew rate measured by the PMOS process monitor to the slew rate for the TT (typical NMOS and typical PMOS) process corner. It is noted from the figure that the relative PMOS slew rate is different for different PMOS process corners, i.e., the relative PMOS slew rate is substantially different for the FF/SF corners (corresponding to fast PMOS process corners), the TT corner, and the FS/SS corners (corresponding to slow PMOS process corners). It is also noted that the PMOS slew rate and the PMOS process monitor performance is substantially independent of the NMOS process corner. Therefore, the relative PMOS slew rate can be used to determine the PMOS process corner.

Figure 6B:
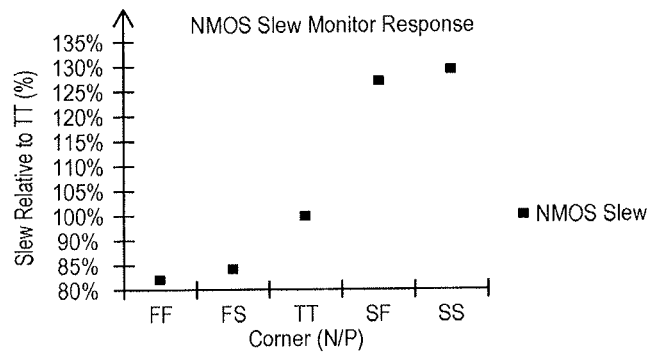

FIG. 6B is a graph showing how the NMOS process monitor response can be used to determine the manufacturing process corner. The vertical axis of the graph shows the "relative slew rate to TT" (hereinafter referred to as "relative NMOS slew rate"), which is measured as the ratio of the slew rate measured by the NMOS process monitor to the slew rate for the TT (typical NMOS and typical PMOS) process corner. It is noted from the figure that the relative NMOS slew rate is different for different NMOS process corners, i.e., the relative NMOS slew rate is substantially different for the FF/FS corners (corresponding to fast NMOS process corners), the TT corner, and the SF/SS corners (corresponding to slow NMOS process corners). It is also noted that the NMOS slew rate and the NMOS process monitor performance is substantially independent of the PMOS process corner. Therefore, the relative NMOS slew rate can be used to determine the NMOS process corner.

Figure 6C:
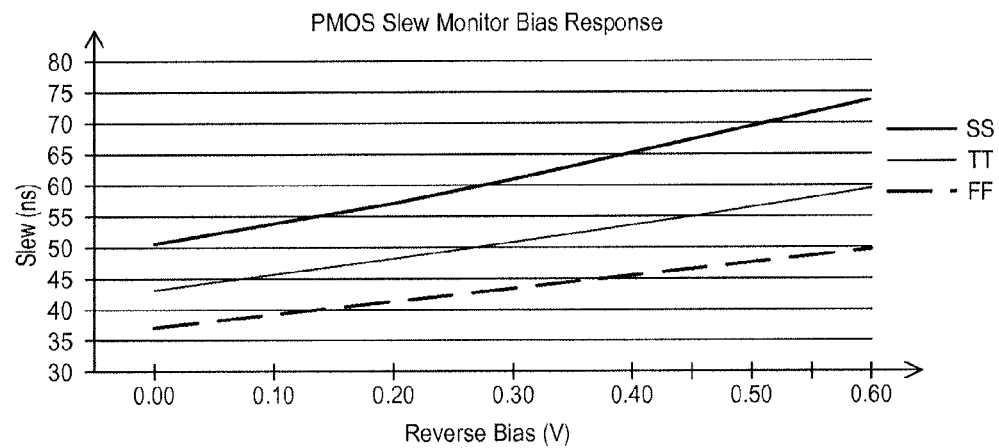
FIGS. 6C and 6D are graphs showing process monitor response to reverse body bias voltage and process variation.

FIG. 6C is a graph showing a response of a PMOS process monitor circuit, according to an embodiment, to reverse body bias voltages at different process corners. The graph shows the measured slew rate as a function of PMOS reverse bias voltage for three different process corners, SS (slow NMOS and PMOS), TT (typical NMOS and PMOS), and FF (fast NMOS and PMOS).

Figure 6D:
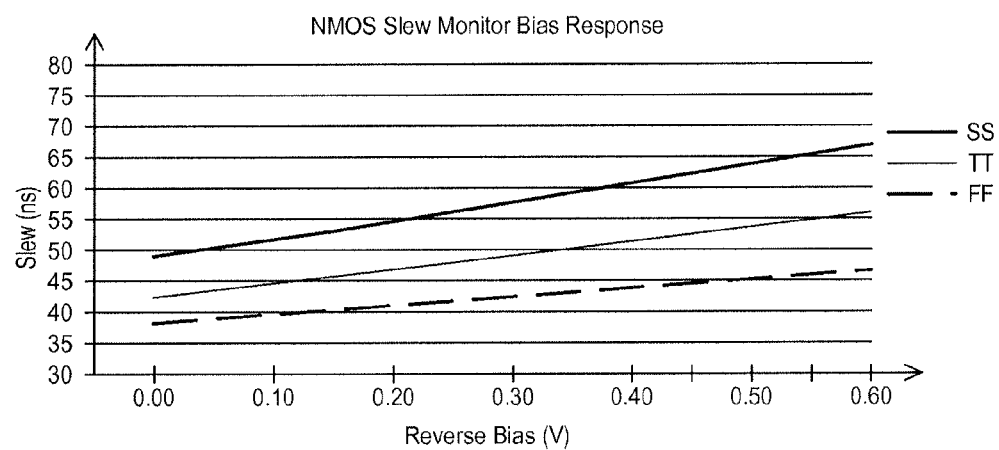

FIG. 6D is a graph showing a response of a NMOS process monitor circuit, according to an embodiment, to reverse body bias voltages at different process corners. The graph shows the measured slew rate as a function of NMOS reverse bias voltage for three different process corners, SS (slow NMOS and PMOS), TT (typical NMOS and PMOS), and FF (fast NMOS and PMOS).

It is observed from these graphs that the response of the PMOS and NMOS process monitors varies in response to both the reverse bias voltage, and the manufacturing process corners. Therefore, the PMOS and NMOS process monitors described above can be used as both a bias voltage monitor as well as a process monitor.

The PMOS and NMOS process monitor results shown above were obtained from simulations performed using process corner models, where the electrical characteristics of one of the transistor types (i.e., NMOS or PMOS) is substantially identical between the intermediate (i.e., FS or SF) and extreme (i.e., SS or FF) corners. These process corners (referred to hereinafter as "square" process corners) are different from conventional process corners, where the electrical characteristics of both the NMOS and PMOS transistors vary between the intermediate and extreme process corners. For the square process corners, the NMOS and PMOS transistor performance in the SF (slow NMOS, fast PMOS) corner are substantially identical to the NMOS transistor performance in the SS (slow NMOS, slow PMOS) corner, and the PMOS transistor performance in the FF (slow NMOS, fast PMOS) corner, respectively. On the other hand, the NMOS and PMOS transistor performance in the FS corner of the square process corners are substantially identical to the NMOS transistor performance in the FF corner and the PMOS transistor performance in the SS corner. The following table illustrates the difference between the conventional process corners and the square process corners, where the "+" table entry indicates a smaller change in transistor electrical characteristics as compared to the change corresponding to the "+++".

TABLE I

| Corner | Conventional Process Corner | | Square Process Corner | |
| --- | --- | --- | --- | --- |
| | NMOS | PMOS | NMOS | PMOS |
| FF | +++ | +++ | +++ | +++ |
| FS | + | − | +++ | --- |
| TT | 0 | 0 | 0 | 0 |
| SF | − | + | --- | +++ |
| SS | --- | --- | --- | --- |

While process monitor circuits and body bias control circuits as described herein and equivalents can be used to monitor any suitable circuit element type, particular embodiments can be included in ICs having transistor with high body coefficients. Examples of such transistors will now be described.

Figure 7A:
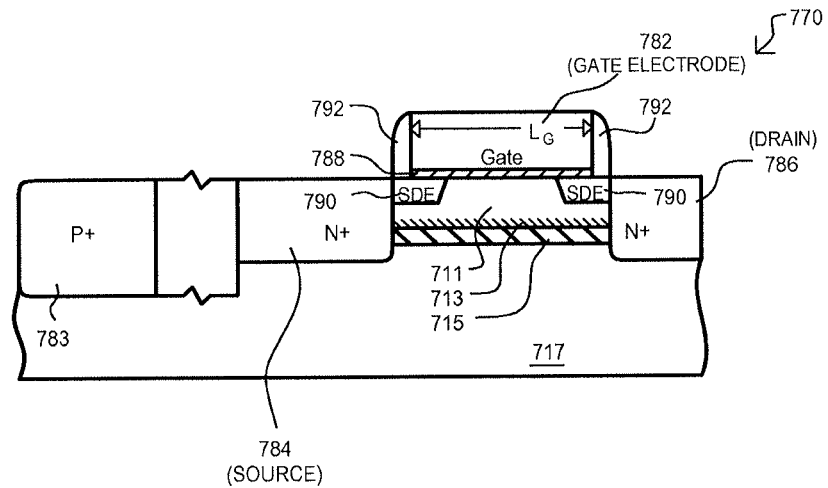
FIGS. 7A to 7C are side cross sectional views of reference transistors that can be included in embodiments.

FIG. 7A shows a deeply depleted channel (DDC) type transistor 770, which can be included in embodiments. For example, a DDC transistor 770 can be a reference transistor that is monitored to reflect the performance of like DDC transistors 770 in an IC device. A DDC transistor 770 can be configured to have an enhanced body coefficient, along with the ability to set a threshold voltage (Vt) with enhanced precision. A DDC transistor 770 can include a gate electrode 782, source 784, drain 786, and a gate dielectric 788 positioned over a substantially undoped channel 711. A gate electrode 782 can have spacers 792 formed in its sides. Optional lightly doped source and drain extensions (SDE) 790 can be positioned respectively adjacent to source 784 and drain 786. Such extensions 790 can extend toward each other, reducing effective length of the substantially undoped channel 711. A body bias voltage can be applied to a well 717 via a body tap 783.

In FIG. 7A, the DDC transistor 770 is shown as an n-channel transistor having a source 784 and drain 786 made of n-type dopant material, formed upon a substrate such as a p-type doped silicon substrate providing a p-well 717. In addition, the n-channel DDC transistor 770 in FIG. 7A can include a highly doped screening region 715 made of p-type dopant material, and a threshold voltage set region 713 made of p-type dopant material.

Figure 7B:
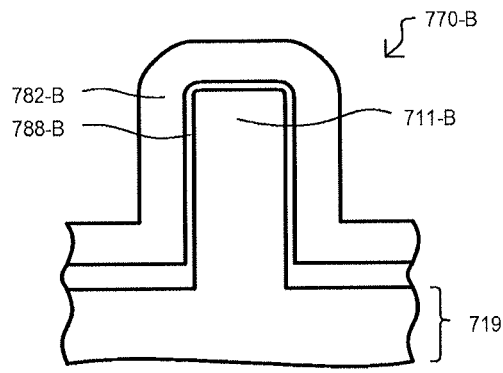

FIG. 7B shows FinFET type transistor 770-B which can be included in embodiments as a reference circuit element corresponding to like elements in an IC device. The FinFET transistor 770-B can include a gate electrode 782-B and gate dielectric 788-B formed on opposing sides of a substantially undoped channel 711-B. The view of FIG. 7B is taken along a channel length. Thus, it is understood that source and drain regions can extend into and out of the view shown.

Figure 7C:
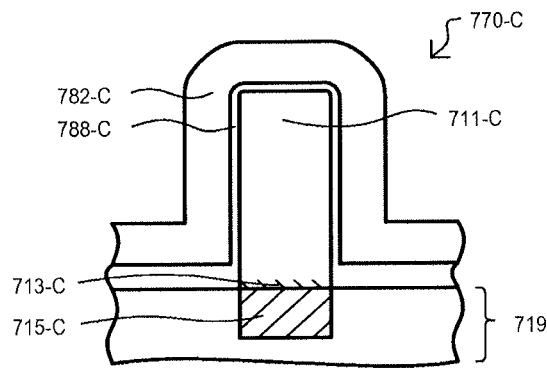

FIG. 7C shows a FinFET type transistor 770-C having a screening region 715-C which can be included in embodiments. As in the case of FIG. 7A, the FinFET transistor 770-C can have a screening region which can be configured to have an enhanced body coefficient, along with the ability to set a Vt with enhanced precision. The transistor 770-C includes a gate electrode 782-C and gate dielectric 788-C formed over a substantially undoped channel 711-C on opposing sides. However, unlike FIG. 7B, a highly doped screening region 715-C is formed in a substrate 719 below substantially undoped channel 711-C. Optionally, a Vt set region 713-C is formed between the screening region 715-C substantially undoped channel 711-C. As in the case of FIG. 7B, the view of FIG. 7C is taken along a channel length, and source and drain regions can extend into and out of the view, separated from screening region 715-C by portions of undoped channel region 711-C.

Embodiments of various structures and manufacturing processes suitable for use in DDC transistors are disclosed in U.S. Pat. No. 8,273,617, issued on Sep. 25, 2012, titled "Electronic Devices and Systems, and Methods for Making and Using the Same", by Scott E. Thompson et al.; U.S. Pat. No. 8,530,286 issued on Sep. 10, 2013 titled "Low Power Semiconductor Transistor Structure and Method of Fabrication Thereof"; U.S. patent application Ser. No. 12/971,955 filed on Dec. 17, 2010 titled "Transistor with Threshold Voltage Set Notch and Method of Fabrication Thereof"; U.S. patent application Ser. No. 12/895,785 filed on Sep. 30, 2010 titled "Advanced Transistors With Threshold Voltage Set Dopant Structures"; and U.S. Pat. No. 8,400,219 issued on Mar. 19, 2013, titled "Analog Circuits Having Improved Transistors, and Method Therefor", by Lawrence T. Clark et al; the disclosures of which are hereby incorporated by reference in their entirety.

In addition, methods and structures for modifying the threshold voltage of DDC transistors are discussed in pending U.S. patent application Ser. No. 13/459,971 titled "Multiple Transistor Types Formed in a Common Epitaxial Layer by Differential Out-diffusion from a Doped Underlayer", filed Apr. 30, 2012, the entirety of which disclosure is incorporated by reference herein.

It is understood that, with appropriate change to substrate or dopant material, conductivities of any of the transistors described above can be switched (i.e., from p-channel to n-channel and vice versa).

The process and bias monitor circuits discussed above are advantageously used in IC devices that are implemented using DDC transistors having an enhanced body coefficient as compared to conventional nanoscale devices. The response of the DDC transistor can vary within a wider range to a change in the body bias voltage applied to the screening region. More specifically, the enhanced body coefficient of the DDC transistor can allow a broad range of ON-current and OFF-current that depends on the body bias voltage applied to the screening region, as compared to the body bias voltage applied to a conventional device. In addition, the DDC transistors have a better transistor matching coefficient (AVT), i.e., a lower threshold variation ($\sigma V_T$) than conventional devices. The lower $\sigma V_T$ provides a lower minimum operating voltage VDD and a wider range of available nominal values of $V_T$. The enhanced body coefficient of the DDC transistor can also allow a broad range of threshold voltage that depends on the body bias voltage applied to the screening region, as compared to the body bias voltage applied to a conventional device. The screening region allows effective body biasing for enhanced control of the operating conditions of a device or a group of devices to be set by controlling the applied body bias voltage. In addition, different operating conditions can be set for devices or groups of devices as a result of applying different body bias voltages.

While embodiments can include pulse extender circuits that rely on the discharging/charging of a capacitor, like that shown in FIG. 3A, other embodiments can include digital pulse extender circuits. Various embodiments of digital pulse extender circuits will now be described.

Digital pulse extender circuits, according to embodiments, can be used to generate an extended pulse signal having an extended pulse duration that is longer than the pulse duration of a received input pulse signal. There can be a predetermined ratio between the extended pulse duration and the input pulse duration.

Figure 8:
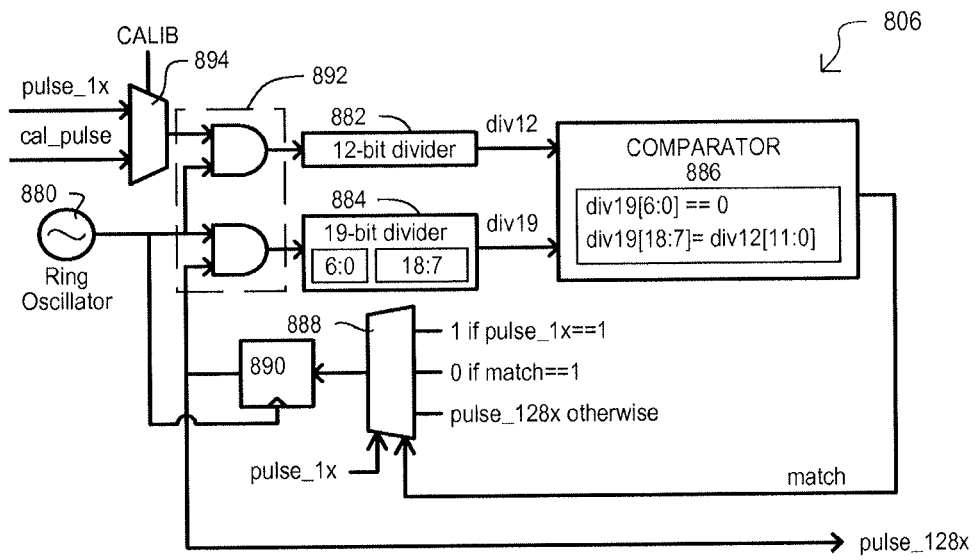
FIG. 8 is a block schematic diagram of a pulse extender circuit according to an embodiment.

FIG. 8 shows a digital pulse extender circuit 806, in accordance with one embodiment. Pulse extender circuit 806 can receive an input signal (pulse_1x) that can include an input pulse, and can generate an extended pulse on an output signal (pulse_128x). In the particular embodiment shown, an extended pulse duration can be approximately some power of two (e.g., $2^7$) times the pulse duration of pulse_1x.

In the particular embodiment of FIG. 8, a pulse extender circuit 806 can receive input signal pulse_1x, which can include a pulse having a duration reflecting a circuit element performance, a clock input (r_clk), which can be a clock signal generated by a ring oscillator 880, and can output an extended pulse signal pulse_128x. Pulse extender circuit 806 can include a first frequency divider 882, a second frequency divider 884, a digital comparator 886, a MUX 888, output logic 890, and input logic 892. Optionally, a pulse extender circuit 806 can include a calibration MUX 894 for selectively inputting the input signal pulse pulse_1x or a calibration pulse (cal_pulse) according to a signal CARIB.

First frequency divider 882 can divide an input pulse according to clock signal r_clk to generate a count value corresponding to the duration of an input pulse of signal pulse_1x. In one embodiment, first frequency divider 882 can be a digital counter, and by operation of input logic 892, can receive clock signal r_clk as a clock input and pulse_1x signal as an enable signal. As a result, the counter can increment a count value while the pulse_1x signal is active (e.g., at a high logic level in FIG. 8). Thus, the value of the count in the counter is representative of the pulse duration of pulse_1x, as measured by the number of ring oscillator clock cycles within duration of the pulse_1x signal. In the very particular embodiment shown, the counter can be a 12-bit counter.

Second frequency divider 884 can also divide according to count clock r_clk. However, second frequency divider 884 can count for a multiple of the count value generated by first frequency divider 882. In the embodiment shown, second frequency divider 884 can also be a counter circuit. Second frequency divider 884 can start counting when the pulse_1x signal transitions to a high logic level, and can stop counting when the count value of the second frequency divider is some multiple (e.g., 128 times) the count in the first frequency divider 882. In one particular embodiment, such a second frequency divider can be implemented as a 19-bit counter, while the first frequency divider can be a 12-bit counter. A count value of the 19-bit counter can be representative of 128 times the pulse duration of the pulse_1x pulse duration, as measured by the number of ring oscillator clock cycles within the pulse_128x signal.

Referring still to FIG. 8, digital comparator 886 can receive a count from the first frequency divider 882 as a first input, and a count from the second frequency divider 884 as a second input (labeled in the figure as div12 and div19, respectively, in FIG. 8). Digital comparator 886 can assert an output signal "match" if the seven least significant bits of div19 are zero, and bits 7 through 18 of div19 are equal to bits 0 through 12 of div12, respectively. Therefore, the match signal is asserted when the count from the second divider is 128 times the count from the first divider.

According to embodiments, the extended pulse signal pulse_128x can be asserted when either pulse_1x or pulse_128x is at a high logic level, and it can be de-asserted once the match signal is asserted. In the embodiment shown in the figure, the extended pulse signal pulse_128x can be generated by operation of MUX 888 and logic 890 (which can be a FF).

By operation of input logic 892, second frequency divider 884 can receive count clock r_clk as a clock input and the extended pulse signal pulse_128x as an enable signal, such that the second frequency divider increments a count based on r_clk while pulse_128x signal is at a high logic level.

In the embodiment of FIG. 8, digital pulse extender circuit 806 can also operate in an optional calibration mode, where a calibration pulse input cal_pulse having a predetermined pulse width is selectively input to the digital pulse extender circuit 806 when the calibrate input CALIB to calibration MUX 894 is asserted. In the calibration mode, the pulse width of the extended pulse signal will be a multiple of the pulse width of the calibration pulse input (cal_pulse). For example, in the embodiment shown in FIG. 8, a pulse width of the extended pulse signal is 128 times the pulse width of an input pulse of signal cal_pulse. Thus, a pulse width of the extended pulse signal can be measured to verify and calibrate the operation of the digital pulse extender circuit.

A digital pulse extender circuit 806 can operate correctly and generate an extended pulse signal for a range of counting clock frequencies (e.g., ring oscillator output frequencies). Typically, a ring oscillator output frequency can be selected to be sufficiently high such that multiple ring oscillator cycles can fit within the pulse width of the input pulse signal pulse_1x. For example, if pulse width of the pulse input signal pulse_1x is in the range of 25 to 40 ns, the ring oscillator output frequency can be set to 2 GHz such that 50 to 80 ring oscillator cycles, respectively, can fit within the pulse width of the pulse_1x signal.

It is noted that even though the extended pulse signal has a duration that is 128 times the duration of the input pulse signal in the embodiment described above, alternative embodiments can use first and/or second dividers having different numbers of bits to generate an extended pulse signal having a duration that is a different multiple of the input pulse duration.

Embodiments of the digital pulse extender circuit described above can be used as part of a process monitor circuit, as described herein or equivalents, where such process monitor circuit generates a slew signal that depends on electrical characteristics of one or more representative circuit elements, such as NMOS or PMOS transistors. Such a signal slew can be converted into a pulse signal. Such a pulse signal can be provided as an input (e.g., pulse_1x) to a digital pulse extender circuit 806. Such process monitor circuits can be used to determine the electrical performance variation of the different transistor types as a result of manufacturing process or other sources of transistor variation.

Figure 9:
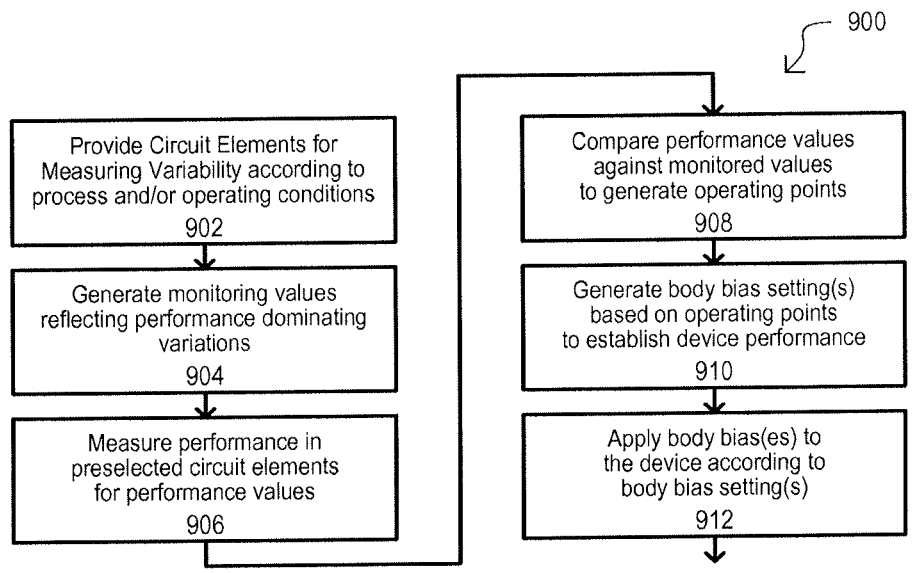
FIG. 9 is a flow diagram of a method according to an embodiment.

FIG. 9 is a flow diagram of a method 900 according to an embodiment. A method 900 can generate body bias voltages based on process monitoring circuits, like those disclosed herein, or equivalents. A method 900 can include providing circuit elements for measuring variability according to process and/or operation conditions (902). Such an action can include providing circuit elements such as transistors of different conductivity types, including DDC type transistors, reflecting the performance variability arising from fabrication process and/or operating conditions. Monitor values can be generated reflecting performance dominating variations (904). Such an action can include generating monitoring values from the provided circuit elements corresponding to "corner" conditions. In particular embodiments, this can include generating a slew based monitor value as described herein, or equivalents. In some embodiments such an action can further include deriving biasing conditions, such as body bias values, that can compensate for corner conditions.

A method 900 can measure performance of preselected circuit elements for performance values (906). In some embodiments, this can include generating slew rate performance values for particular transistors of an IC device, as described herein, or an equivalent. Performance values can be compared to monitored values to generate operating points (908). In a very particular embodiment, such an action can include determining the corner conditions of transistors of an IC device (based on a set of previously generated monitored values). Such conditions can be compared to a desired performance.

A method 900 can generate body bias settings based on the operating points to establish the performance of a device (910). Such an action can include generating body bias voltages for groups of transistors based on a slew rate corresponding to a reference transistor of the same type. The body bias voltages can be applied in the device according to the body bias settings (912). Such an action can include the static application of body bias voltages, or the dynamic application of body bias voltages based on operational mode, temperature conditions, etc.

Figure 10:
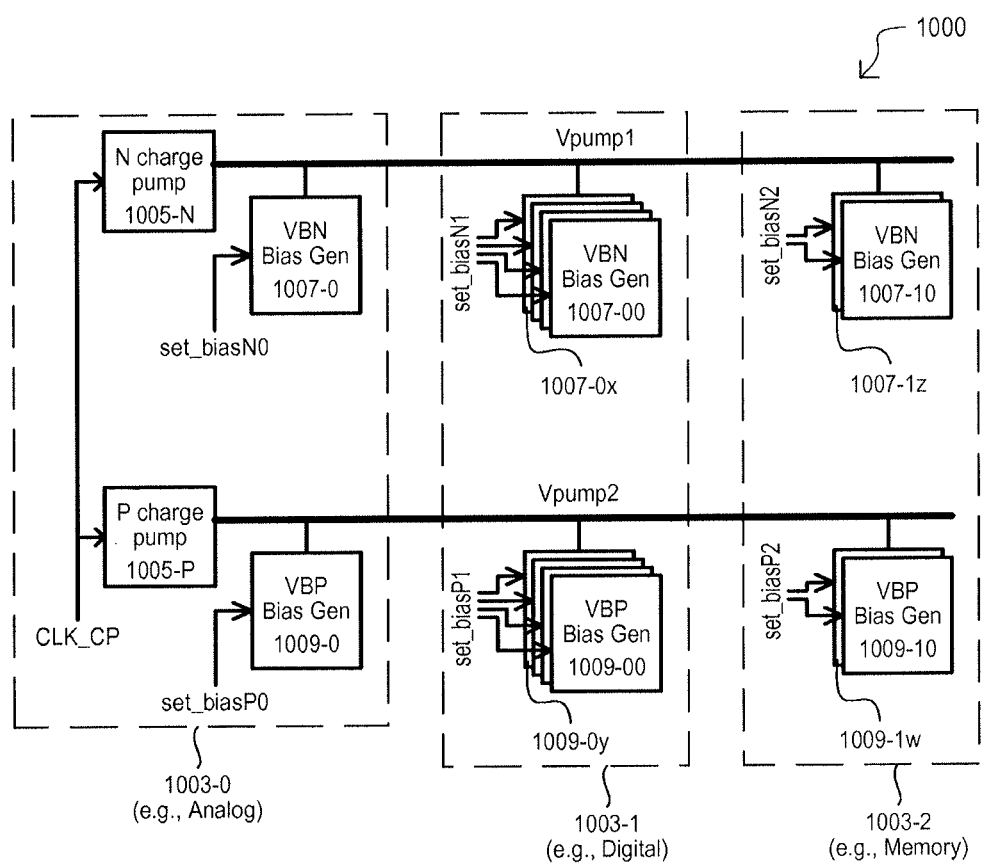
FIG. 10 is a block diagram of body bias control system according to an embodiment.

FIG. 10 shows an IC device 1000 according to another embodiment. An IC device 1000 can include various sections 1003-0 to 1003-2, any of which can include one or more body bias generator circuits that apply an adjustable body bias to various transistors. A value of such body bias voltages can be derived from a performance monitor values, including slew based performance monitor values as described herein, or equivalents.

IC device 1000 can include a first section 1003-0 that includes a first charge pump 1005-N and a second charge pump 1005-P. A first charge pump 1005-N can generate a global body bias voltage Vpump1 for n-channel transistors. A second charge pump 1005-P can generate a global body bias voltage Vpump2 for p-channel transistors. Such global body bias voltages (Vpump1/2) can be provided to each section (1003-0 to -2). In the embodiment shown, first and second charge pumps (1005-N/P) can generate global body bias voltages in response to a charge pump clock signal CLK_CP.

Each section (1003-0 to -2) can include one or more body bias generator circuits which can apply a body bias voltage to a group of transistors having a level established by bias set values. In some embodiments, bias set values can be generated using slew-based monitored values, as described herein, or equivalents. In a particular embodiment, body bias set values can be generated as described for block 910 in FIG. 9.

In FIG. 10, IC device 1000 can include an analog section 1003-0, a digital section 1003-1, and a memory section 1003-2. An analog section 1003-0 can include an n-channel transistor body bias generator circuit 1007-0, which can generate a body bias for n-channel transistors of section 1003-0 based on bias set values set_biasN0 and using global body bias Vpump1. Similarly, an analog section 1003-0 can also include a p-channel transistor body bias generator circuit 1009-0, which can generate a body bias for p-channel transistors of section 1003-0 based on bias set values set_biasP0 and using global body bias Vpump2.

Digital section 1003-1 can include body bias generator circuits like section 1003-0, but can include many more such circuits to enable different body biases for different circuit sections. N-channel body bias generator circuits are shown as 1007-00 to 0x, and each receive different bias set values set_biasN1. P-channel body bias generator circuits are shown as 1009-00 to 0y and each receive different bias set values set_biasP1.

Memory section 1003-2 can include body bias generator circuits like section 1003-0, but can include two more such circuits to enable different body biases for different circuit sections. N-channel body bias generator circuits are shown as 1007-10 to 1z, and each receive different bias set values set_biasN2. P-channel body bias generator circuits are shown as 1009-10 to 1w and each receive different bias set values set_biasP2.

In some embodiments, bias set values can be digital values. Further, charge pump 1005-N can generate a global bias voltage Vpump1 that is lower than the ground supply level of the IC device 1000, and charge pump 1005-P can generate a global bias voltage Vpump2 that is higher than the power supply level of the IC device 1000. A clock signal CLK_CP can operate at some nominal frequency (e.g., 25 MHz) but can be programmed or selected to operate at a higher or lower frequency.

Any or all of the various bias set values (set_biasN0, set_biasP0, set_biasN1, set_biasP1, set_biasN2, or set_biasP2) can be generated in response to a slew based process monitor circuit as described herein, or an equivalent.

Figure 11:
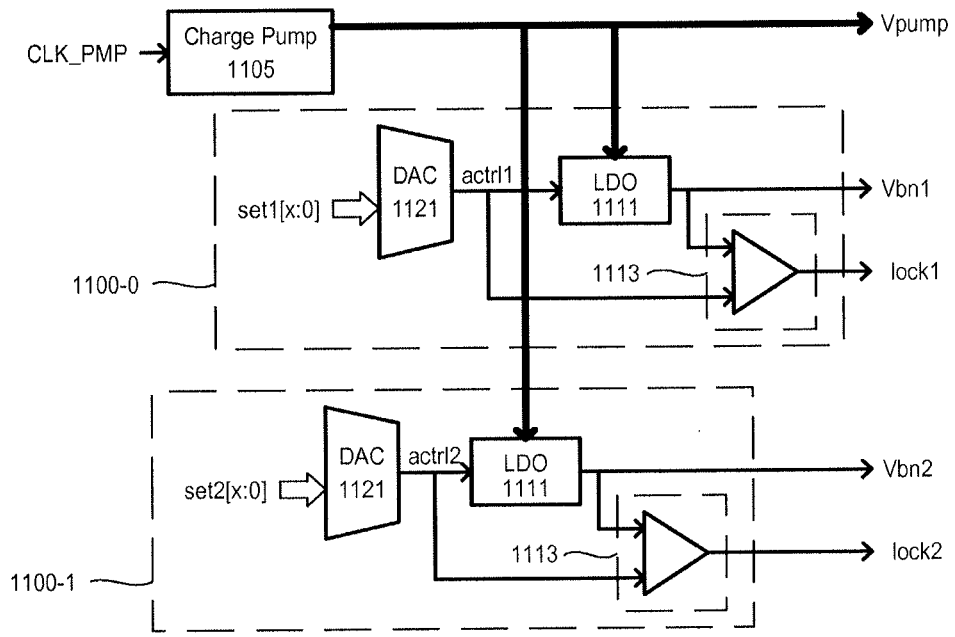
FIG. 11 is a block schematic diagram of body bias control circuits according to an embodiment.

FIG. 11 shows examples of a body bias generator circuits 1100-0/1 according to an embodiment. Body bias generator circuits (1100-0/1) can each use a low dropout regulator circuit (LDO) (1111) to generate body bias voltages (Vbn1, Vbn2) that are fractions of a global body bias voltage Vpump. A global body bias voltage Vpump can be provided by a voltage source 1105, which can be a charge pump, or the like.

In the embodiment shown, operating points for each LDO 1111 can be established by a bias set values (set1[x:0], set2[x:1]). Such bias set values (set1[x:0], set2[x:1]) can be applied to digital-to-analog converters (DAC) 1121 to generate an analog control value (actrl1, actrl2) for LDOs 1111. In the embodiment, LDOs 1111 can force their body bias voltages (Vbn1, Vbn2) to match the analog control values (actrl1, actrl2). In the very particular embodiment shown, bias set values ([set1[x:0], set2[x:1]) can be generated in response to slew based monitor values generated as described herein, and equivalents.

In the particular embodiment shown, each body bias generator circuit 1100-0/1 can include a comparator 1113 which can generate a lock signal (lock1, lock2) once a body bias voltage (Vbn1, Vbn2) matches its corresponding analog control value (actrl1, actrl2).

Figure 12:
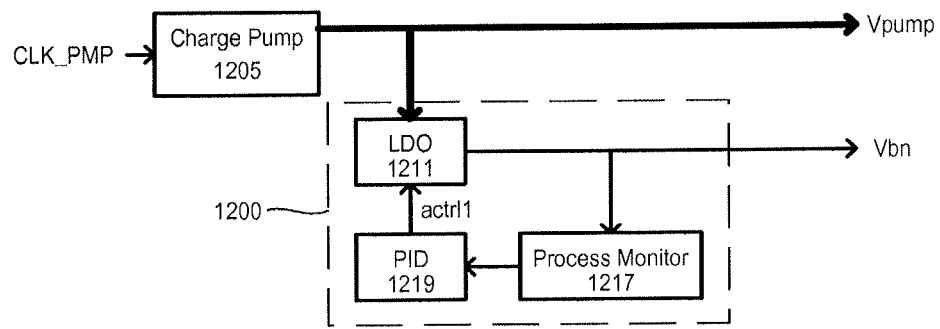
FIG. 12 is a block diagram of a body bias control circuit according to another embodiment.

FIG. 12 shows examples of a body bias generator circuit 1200 according to another embodiment. Body bias generator circuit 1200 can control a body bias voltage based with a self-calibrating, continuous feedback control system. A feedback loop can include a process monitor circuit, such a slew-based process monitor circuit as described herein.

In the particular embodiment shown, body bias generator circuit 1200 can include an LDO 1211, process monitor circuit 1217, and a feedback circuit 1219, which in a particular embodiment, can be a proportional-integrator-derivative (PID) controller. LDO 1211 can establish a body bias voltage Vbn based on an analog control value actrl using a global body bias voltage Vpump from a voltage source, such as a charge pump 1205. A process monitor circuit 1217 can include one or more slew based process monitor circuits as described herein, or an equivalent.

In operation, a generated body bias voltage Vbn can be applied to one or more reference elements within process monitor circuit 1217. The performance of the reference element can be monitored. If performance does not meet a target value, feedback circuit 1219 can adjust an analog control signal (actrl) to adjust a bias voltage to bring circuit element performance toward a desired value. Such feedback can continue until a reference circuit element meets a desired performance.

As will be understood, wafers and die supporting multiple transistor types, including those with and without the described dopant layers and structures are contemplated for use with the embodiments and equivalents. Electronic devices that include the disclosed transistor structures or are manufactured in accordance with the disclosed processes can incorporate die configured to operate as "systems on a chip" (SoC), advanced microprocessors, radio frequency, memory, and other die with one or more digital and analog transistor configurations, and are capable of supporting a wide range of applications, including wireless telephones, communication devices, "smart phones", embedded computers, portable computers, personal computers, servers, and other electronic devices. Electronic devices can optionally include both conventional transistors and transistors as disclosed, either on the same die or connected to other die via motherboard, electrical or optical interconnect, stacking or through used of 3D wafer bonding or packaging. According to the methods and processes discussed herein, a system having a variety of combinations of analog and/or digital transistor devices, channel lengths, and strain or other structures can be produced.

It should be appreciated that in the foregoing descriptions of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of the invention.

It is also understood that the embodiments may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit, comprising:
at least one slew generator circuit comprising at least one body biasable reference transistor, the slew generator circuit configured to generate at least a first signal having a slew rate that varies according to characteristics of the reference transistor;
a pulse generator circuit configured to generate a pulse signal having a first pulse with a duration corresponding to the slew rate of the first signal;
a counter configured to generate a count value corresponding to the duration of the first pulse;
a pulse extender circuit coupled to receive the pulse signal and configured to generate an extended pulse signal with an extended pulse; wherein
the duration of the extended pulse is proportional to the duration of the first pulse;
the at least one slew generator circuit includes an n-channel reference transistor and a p-channel reference transistor, each of the n-channel reference transistor and the p-channel transistor having a first threshold voltage setting; and
the integrated circuit includes other circuits that include transistors fabricated with the same process as the n-channel and p-channel reference transistors, the other circuits having transistors wherein at least some transistors have a second threshold voltage setting.

2. The integrated circuit of claim 1, wherein:
the at least one reference transistor includes a heavily doped region to which a body bias is coupled.

3. The integrated circuit of claim 1, wherein:
the at least one reference transistor further includes a body region, a substantially undoped channel and a doped screening region formed under the substantially undoped channel and above the body region, the screening region being doped to a higher concentration than the body region.

4. The integrated circuit of claim 1, further including:
circuits configured to adjust the operating characteristics of other transistors of the integrated circuit based on the duration of the first pulse, the characteristic selected from the group of: transistor speed and transistor power consumption.

5. The integrated circuit of claim 1, wherein:
the pulse extender receives an input pulse signal at a first pulse, and generates an extended pulse signal as a digital multiplier of the first pulse, the pulse extender further including a frequency divider.

6. The integrated circuit of claim 1, further including:
a pulse extender circuit coupled to receive the pulse signal and configured to generate an extended pulse signal with an extended pulse having a duration proportional to the first pulse; and
the counter increments a count value during the duration of the extended pulse.

7. The integrated circuit of claim 1, wherein
the at least one slew generator circuit includes
an n-channel slew generator circuit configured to generate the first signal, and a slew rate of the first signal varies according to the operation of an n-channel reference transistor, and
a p-channel slew generator circuit configured to generate a second signal, and a slew rate of the second signal varies according the operation of a p-channel reference transistor;
wherein the integrated circuit includes other circuits that include transistors fabricated with the same process as the n-channel and p-channel reference transistors.

8. The integrated circuit of claim 1, further comprising:
at least one body bias control circuit configured to generate a body bias voltage for other transistors of the integrated circuit that varies in response to the count value.

9. An integrated circuit, comprising:
at least one slew generator circuit comprising at least one reference transistor, the slew generator circuit configured to generate at least a first slew signal having a slew rate that varies according to characteristics of the reference transistor;
a pulse generator circuit coupled to receive the first slew signal and configured to drive a pulse signal to a first value when a level of the first slew signal is within first and second limits, and configured to drive the pulse signal to a second value when the level of the first slew signal is outside of the first and second limits;
a counter configured to generate a count value corresponding to a duration of the pulse signal at the first value;
a digital pulse extender circuit coupled to receive the pulse signal and configured to generate an extended pulse signal with an extended pulse, the duration of the extended pulse being proportional to the duration of the first pulse being at the first value; and
at least one body bias control circuit configured to generate a body bias voltage for at least some portions of the integrated circuit in response to the duration of the extended pulse.

10. The integrated circuit of claim 9, wherein:
the at least one slew generator comprises a load capacitor coupled to the source-drain path of the at least one reference transistor;
the pulse generator circuit includes
a first comparator having one input coupled to receive a voltage from the load capacitor, and a second input coupled to a first limit voltage,
a second comparator having one input coupled to receive the voltage from the load capacitor, and a second input coupled to a second limit voltage, and
logic circuits coupled to outputs of the first and second comparators, and configured to output the pulse signal.

11. The integrated circuit of claim 9, wherein:
the at least one reference transistor includes a body region and a screening region formed under a substantially undoped channel, the screening region positioned between the substantially undoped channel and the body region, with the screening region being doped to a higher concentration than body region.

12. The integrated circuit of claim 9, wherein:
the at least one slew generator circuit includes
an n-channel slew generator circuit configured to generate the first pulse signal with a pulse having a duration that varies according to the operation of an n-channel reference transistor, and
a p-channel slew generator circuit configured to generate a second pulse signal having a pulse duration that varies according the operation of a p-channel reference transistor; wherein
the integrated circuit includes other circuits that include transistors fabricated with the same process as the n-channel and p-channel reference transistors.

13. An integrated circuit, comprising:
at least one slew generator circuit comprising at least one body biasable reference transistor, the slew generator circuit configured to generate at least a first signal having a slew rate that varies according to characteristics of the reference transistor;
a pulse generator circuit configured to generate a pulse signal having a first pulse with a duration corresponding to the slew rate of the first signal;
a counter configured to generate a count value corresponding to a duration of the first pulse;
a pulse extender circuit coupled to receive the pulse signal and configured to generate an extended pulse signal with an extended pulse;
wherein the duration of the extended pulse is proportional to the duration of the first pulse; and
wherein the pulse extender receives an input pulse signal at a first pulse, and generates an extended pulse signal as a digital multiplier of the first pulse, the pulse extender further including a frequency divider.

* * * * *